(12) United States Patent
Barna et al.

(10) Patent No.: US 7,755,018 B2
(45) Date of Patent: *Jul. 13, 2010

(54) DIFFERENTIAL COLUMN READOUT SCHEME FOR CMOS APS PIXELS

(75) Inventors: Sandor L. Barna, Pasadena, CA (US); Alex Krymski, La Crescenta, CA (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 12/405,514

(22) Filed: Mar. 17, 2009

(65) Prior Publication Data

US 2009/0180016 A1    Jul. 16, 2009

Related U.S. Application Data

(60) Division of application No. 11/637,239, filed on Dec. 12, 2006, now Pat. No. 7,525,080, which is a continuation of application No. 11/167,076, filed on Jun. 27, 2005, now Pat. No. 7,154,078, which is a continuation of application No. 10/230,176, filed on Aug. 29, 2002, now Pat. No. 6,919,551.

(51) Int. Cl.
*H01L 27/00* (2006.01)

(52) U.S. Cl. ............................ 250/208.1; 348/241

(58) Field of Classification Search .......... 250/208.1; 348/241, 273
See application file for complete search history.

(56) References Cited

U.S. PATENT DOCUMENTS

| | | | |
|---|---|---|---|
| 5,736,895 A | 4/1998 | Yu et al. | |
| 6,140,630 A | 10/2000 | Rhodes | |
| 6,204,524 B1 | 3/2001 | Rhodes | |
| 6,222,175 B1 | 4/2001 | Krymski | |
| 6,423,994 B1 | 7/2002 | Duidash | |
| 6,529,237 B1 | 3/2003 | Tsay et al. | |

(Continued)

OTHER PUBLICATIONS

Iliana L. Fujimori, et al., "A 256 × 256 CMOS Differential Passive Pixel Imager with FPN Reduction Techniques"; 2000 IEEE International Solid State Circuits Conference, Feb. 7, 2000, pp. 106-107.

(Continued)

*Primary Examiner*—Georgia Y Epps
*Assistant Examiner*—Kevin Wyatt
(74) *Attorney, Agent, or Firm*—Dickstein Shapiro LLP

(57) ABSTRACT

The present invention provides an improved column readout circuitry and method of operation which minimizes substrate and other common mode noise during a read out operation. The circuit improves the consistency of the pixel to pixel output of the pixel array and increases the dynamic range of the pixel output. This is accomplished by obtaining a differential readout of the reset signal and integrated charge signal from a desired pixel along with the reset signal and charge signal from a reference circuit. In this manner common mode noise can be minimized by a combination of signals from the desired and reference pixels in the sample and hold aspect of the column circuitry. In one exemplary embodiment of the invention, a 3T pixel arrangement is used. In another exemplary embodiment, a 4T arrangement is used. Additional exemplary embodiments provide differential column readout circuitry that can be used with any two signal sources.

21 Claims, 24 Drawing Sheets

U.S. PATENT DOCUMENTS

| | | |
|---|---|---|
| 6,795,117 B2 | 9/2004 | Tay |
| 7,084,912 B2 | 8/2006 | Chieh |
| 2002/0051067 A1* | 5/2002 | Henderson et al. .......... 348/241 |
| 2002/0158982 A1 | 10/2002 | Kokubun et al. |
| 2004/0051802 A1 | 3/2004 | Krymski |

OTHER PUBLICATIONS

Brent Keeth, et al., "DRAM Circuit Design: A Tutorial", IEEE Solid-State Circuits Society, Chapter 3, pp. 69-103, 2001.

* cited by examiner

US 7,755,018 B2

DIFFERENTIAL COLUMN READOUT SCHEME FOR CMOS APS PIXELS

This application is a divisional of application Ser. No. 11/637,239, filed Dec. 12, 2006, now U.S. Pat. No. 7,525,080, which is a continuation of application Ser. No. 11/167,076, filed on Jun. 27, 2005, now U.S. Pat. No. 7,154,078, which is a continuation of application Ser. No. 10/230,176, filed Aug. 29, 2002, now U.S. Pat. No. 6,919,551, the disclosures of which are incorporated by reference in their entireties.

FIELD OF THE INVENTION

The invention relates generally to improved semiconductor imaging devices and in particular to an imaging device which can be fabricated using a standard CMOS process. Particularly, the invention relates to a CMOS active pixel sensor (APS) imager having an array of pixel cells and to the column circuitry for reading the cells.

BACKGROUND OF THE INVENTION

There is a current interest in CMOS active pixel imagers for possible use as low cost imaging devices. An exemplary pixel circuit of a CMOS active pixel sensor (APS) is described below with reference to FIG. 1. Active pixel sensors can have one or more active transistors within the pixel unit cell, can be made compatible with CMOS technologies, and promise higher readout rates compared to passive pixel sensors. The FIG. 1 circuit 100 exemplary pixel cell 150 is a 3T APS, where the 3T is commonly used in the art to designate use of three transistors to operate the pixel. A 3T pixel has a photodiode 162, a reset transistor 184, a source follower transistor 186, and a row select transistor 188. It should be understood that FIG. 1 shows the circuitry for operation of a single pixel, and that in practical use there will be an M times N array of identical pixels arranged in rows and columns with the pixels of the array accessed using row and column select circuitry, as described in more detail below.

The photodiode 162 converts incident photons to electrons which collect at node A. A source follower transistor 186 has its gate connected to node A and thus amplifies the signal appearing at Node A. When a particular row containing cell 150 is selected by a row selection transistor 188, the signal amplified by transistor 186 is passed on a column line 170 to the readout circuitry. The photodiode 162 accumulates a photo-generated charge in a doped region of the substrate. It should be understood that the CMOS imager might include a photogate or other photoconversion device, in lieu of a photodiode, for producing photo-generated charge.

A reset voltage source Vrst is selectively coupled through reset transistor 184 to node A. The gate of reset transistor 184 is coupled to a reset control line 190 which serves to control the reset operation in which Vrst is connected to node A. The row select control line 160 is coupled to all of the pixels of the same row of the array. Voltage source Vdd is coupled to a source following transistor 186 and its output is selectively coupled to a column line 170 through row select transistor 188. Although not shown in FIG. 1, column line 170 is coupled to all of the pixels of the same column of the array and typically has a current sink at its lower end. The gate of row select transistor 188 is coupled to row select control line 160.

As know in the art, a value is read from pixel 150 in a two step process. During a charge integration period the photodiode 162 converts photons to electrons which collect at the node A. The charges at node A are amplified by source follower transistor 186 and selectively passed to column line 170 by row access transistor 188. During a reset period, node A is reset by turning on reset transistor 184 and the reset voltage is applied to node A and read out to column line 170 by the source follower transistor 186 through the activated row select transistor 188. As a result, the two different values—the reset voltage and the image signal voltage—are readout from the pixel and sent by the column line 170 to the readout circuitry where each is sampled and held for further processing as known in the art.

All pixels in a row are read out simultaneously onto respective column lines 170 and stored in sample and hold circuits. Then the column circuitry in the sample and hold circuits are activated in sequence for reset and signal voltage read out. The rows of pixels are also read out in sequence onto the respective column lines.

FIG. 2 shows a CMOS active pixel sensor integrated circuit chip that includes an array of pixels 230 and a controller 232 which provides timing and control signals to enable reading out of signals stored in the pixels in a manner commonly known to those skilled in the art. Exemplary arrays have dimensions of M times N pixels, with the size of the array 230 depending on a particular application. The imager is read out a row at a time using a column parallel readout architecture. The controller 232 selects a particular row of pixels in the array 230 by controlling the operation of row addressing circuit 234 and row drivers 240. Charge signals stored in the selected row of pixels are provided on the column lines 170 (FIG. 1) to a readout circuit 242 in the manner described above. The pixel signal read from each of the columns then can be read out sequentially using a column addressing circuit 244. Differential pixel signals (Vrst, Vsig) corresponding to the read out reset signal and integrated charge signal are provided as respective outputs Vout1, Vout2 of the readout circuit 242.

FIG. 3 more clearly shows the rows and columns 349 of pixels 350. Each column includes multiple rows of pixels 350. Signals from the pixels 350 in a particular column can be read out to a readout circuit 352 associated with that column. The read out circuit 352 includes sample and hold circuitry for acquiring the pixel reset and integrated charge signals. Signals stored in the readout circuits 352 then can be read sequentially column-by-column to an output stage 354 which is common to the entire array of pixels 330. The analog output signals can then be sent, for example, to a differential analog circuit and which subtracts the reset and integrated charge signals and sends them to an analog-to-digital converter (ADC), or the reset and integrated charge signals are each supplied to the analog-to-digital converter.

FIG. 4 more clearly shows the column readout circuit 352 includes the sample and hold read out circuit in the prior art. The sample and hold circuit 400 is capable of sampling and holding two signals for subsequent subtraction. For example, a reset signal would be stored on capacitor 418 and the charge accumulated photo signal would be stored on capacitor 420. A downstream circuit subtracts these signals and outputs a signal to a digital to analog converter.

The capacitors 418, 420 are typically clamped to a clamping voltage on their back sides by switch 415 before a sampling operation. To store the pixel image signal on capacitor 420, a pulse signal is applied which temporarily closes the SHS switch 412 and couples the pixel with the front side of capacitor 420 through the column line 402. Thereafter, the SHS switch 412 is opened, which retains the charge accumulated signal in the capacitor 420 (assuming that Col. Select switch 428 is open). Similarly, to store the reset signal on capacitor 418, a pulse signal temporarily closes the SHR switch 410 and couples the pixel with the front side of capacitor 418 through the column line 402. Thereafter, the SHR switch 410 is opened, which retains the reset signal in the capacitor 418 (assuming that Col. Select switch 426 is open).

In order to read out the stored reset and charge accumulated signals from the capacitors 418, and 420 a pulse signal is applied closing a crowbar switch 413 and Col. Select switches 426 and 428 thereby forcing signals on capacitors 418, 420 into differential amplifier 434. Signals output from amplifier 434 are provided to downstream circuits. Although amplifier 434 is shown as processing the reset and image signals to provide differential signals to downstream circuits, amplifier 434 can also be arranged to subtract the signals and provide single ended signals to downstream processing circuits.

As fabrication techniques get better, an increasing number of digital processing circuits are being implemented on the same chip as an image sensor. This increases substrate noise coupling to a pixel, which can compromise the signal to noise ratio of the image sensor core. The substrate noise occurs when spurious noise signals are injected locally into the substrate through ohmic or capacitive coupling, thereby breaking the equipotentiality of the substrate.

In traditional CMOS APS devices the two signals, corresponding to the image signal level (Vsig) and the reset signal level (Vrst) are read out of each pixel at two different times. The Vsig and Vrst voltages stored on the respective capacitors 420, 418 with reference to the precharge clamping voltage Vclamp. Thus, $$V\text{sig} = V\text{sig} - V\text{clamp} \quad (1)$$

where Vclamp is the clamping voltage. Likewise, $$V\text{rst} = V\text{rst} - V\text{clamp} \quad (2)$$

During readout the difference between Vsig and Vrst voltages is generated as an output. Ideally, this will be:

$$V\text{diff} = V\text{rst} - V\text{sig} \quad (3)$$

However, in practice there will be an uncorrelated noise component associated with Vclamp, giving an actual output voltage of $$V\text{diff} = V\text{rst} - V\text{sig} - (V\text{clamp(rst)} - V\text{clamp(sig)}) \quad (4)$$

It would be desirable to have a column readout circuit that compensates for substrate and other common mode noise that is encountered during a pixel read out operation and eliminates the noise term.

BRIEF SUMMARY OF THE INVENTION

The present invention provides an improved column readout circuitry and method of operation which minimizes substrate and other common mode noise during a read out operation. The circuit improves the consistency of the pixel to pixel output of the pixel array and increases the dynamic range of the pixel output. This is accomplished by obtaining a differential readout of the reset signal and image signal from a desired pixel along with the reset signal and charge signal from a reference circuit. In this manner common mode noise seen by both can be minimized by a combination of signals from the desired pixel and reference circuit in the sample and hold portion of the column circuitry. In one exemplary embodiment of the invention, a 3T pixel arrangement is used. In another exemplary embodiment, a 4T arrangement is used. Additional exemplary embodiments provide differential column readout circuitry that can be used with any two signal sources.

These and other features and advantages of the invention will be more readily understood from the following detailed description of the invention which is provided in connection with the accompanying drawings.

DETAILED DESCRIPTION OF THE INVENTION

Figure 1:
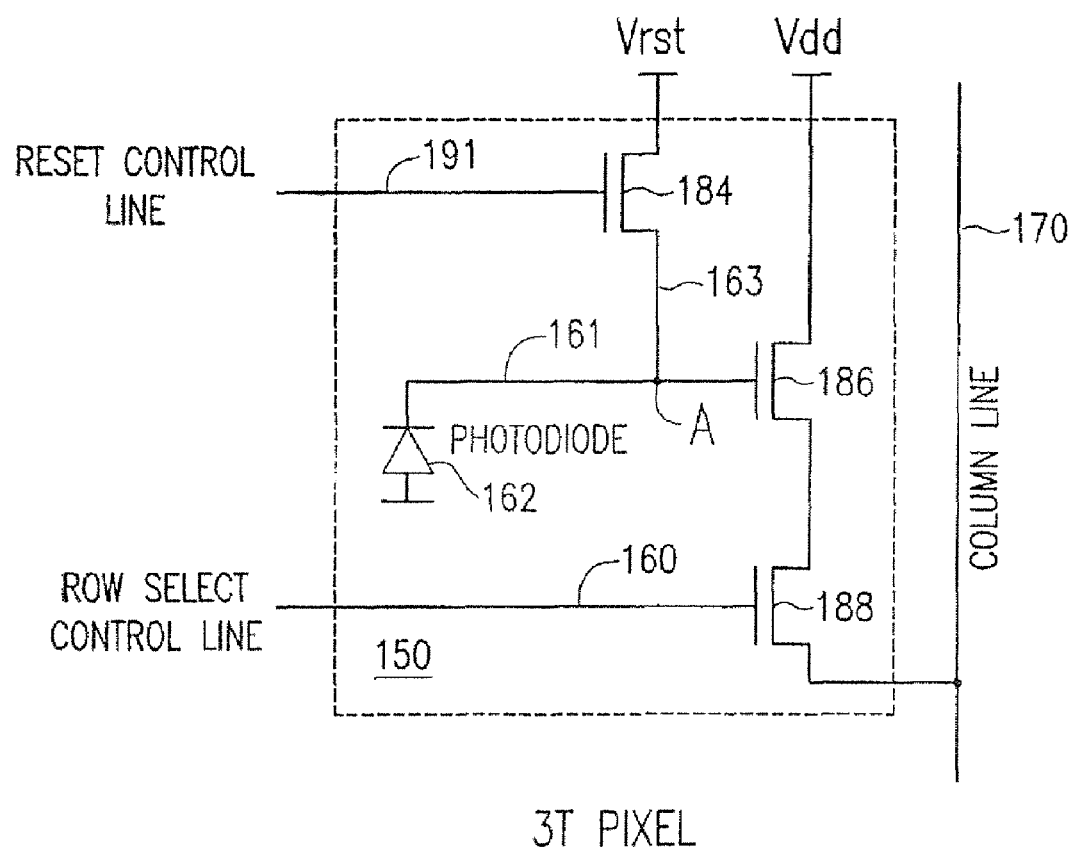
FIG. 1 is a prior art active pixel.
Figure 2:
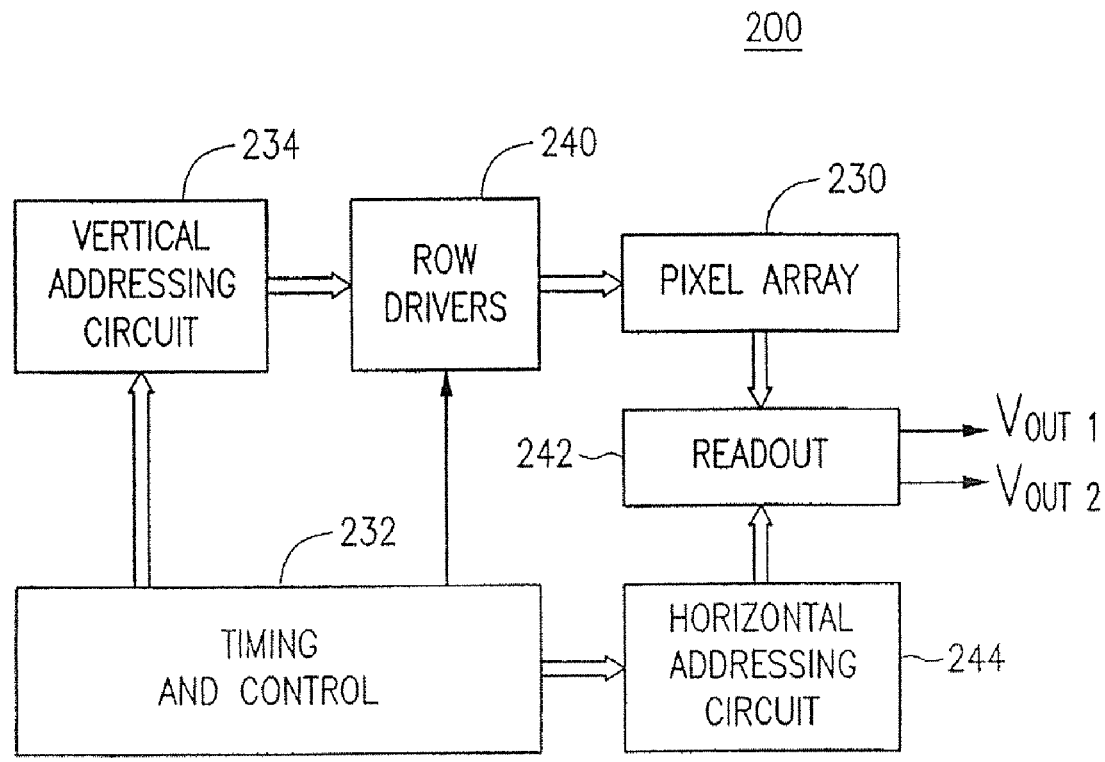
FIG. 2 is a block diagram of a prior art CMOS active sensor chip.
Figure 3:
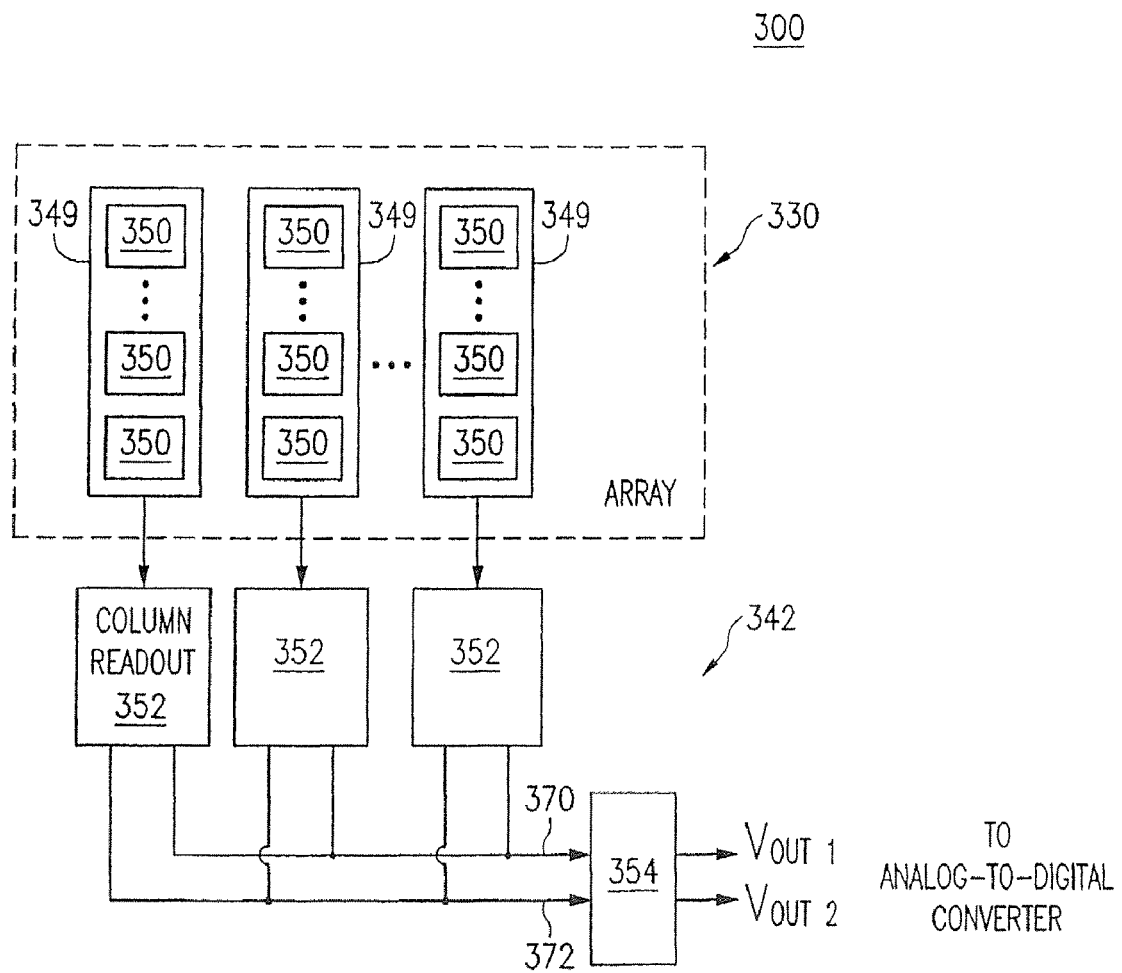
FIG. 3 is a block diagram of a prior art array of active pixels and an associated readout circuit.
Figure 4:
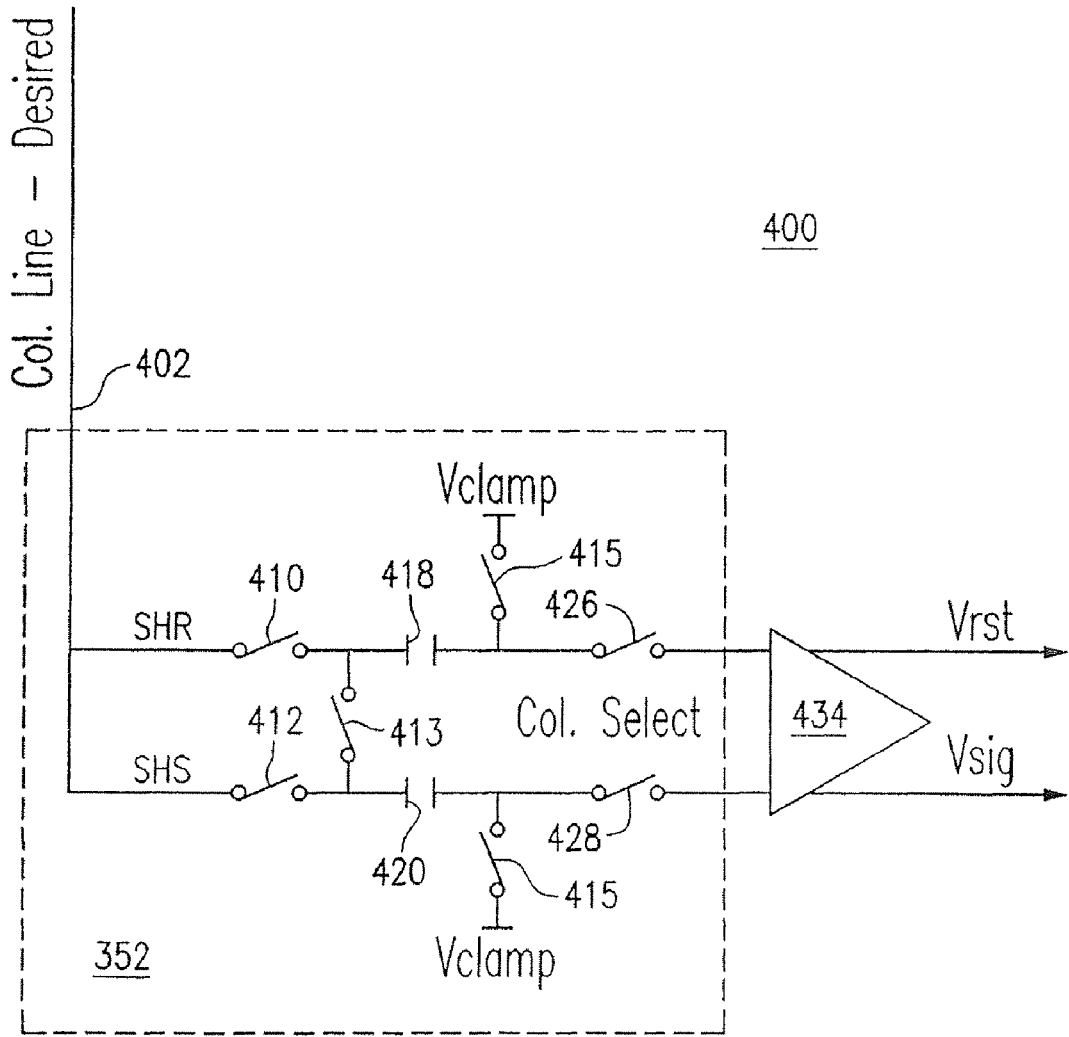
FIG. 4 is a prior art sample and hold circuit.

In the following detailed description, reference is made to the accompanying drawings, which form a part hereof, and in which is shown by way of illustration specific embodiments in which the invention may be practiced. These embodiments are described in sufficient detail to enable those of ordinary skill in the art to make and use the invention, and it is to be understood that structural, logical or other changes may be made to the specific embodiments disclosed without departing from the spirit and scope of the present invention.

To minimize additional new noise, the present invention utilizes a differential column readout circuit using two signal sources—a desired pixel and a reference circuit—as the sources of reference differential signals which are combined and output from the column readout circuit 504. In an exemplary embodiment, shown in FIG. 5, there is no actual photosignal from the reference circuit 540 available; however a comparison value from the reference circuit 540 is taken, which is taken at the same time of taking the photo signal of the desired pixel 550. The reset signal of the reference circuit 540 is taken at the same time that the reset signal of the desired pixel 550 is taken. Since both the desired pixel 550 and the reference circuit 540 see the same bias voltage, any induced ground noise or other common mode noise is also substantially the same. By subtracting sampled signal values of the reference circuit 540 from sampled signal values from the desired pixel 550 and factoring in biases, the common noise is cancelled out and removed.

Column readout circuit 504 provides three bias sources ensuring a differential output. The bias sources are a pbias current source 575, a tail bias current source 578, and a common mode feedback (CMF) current bias source 580. The pbias component, introduced through two pbias current transistors 574, 576, is equivalent to the tail current bias which is introduced through tail current bias transistor 578. A CMF current bias, introduced through CMF current bias transistor 580, compensates for any difference between the tail current bias transistor 578 and the two pbias current transistors 574, 576. The combination of these three biases permit differential sampling of the desired pixel 550 and the reference circuit 540.

Figure 5:
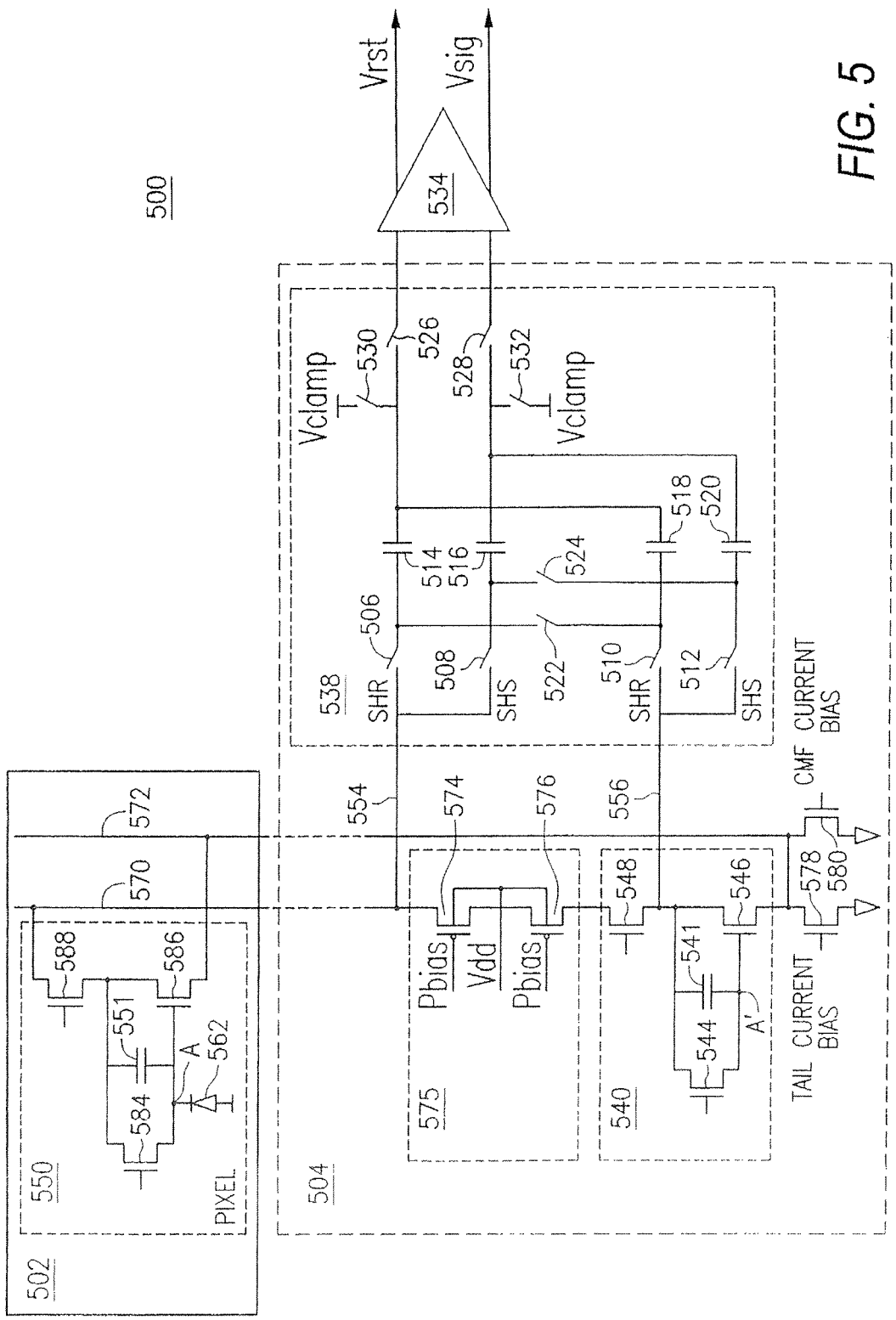
FIG. 5 is a differential readout pixel circuit and associated column readout circuitry in accordance with an exemplary embodiment of the invention.

FIG. 5 illustrates a fully differential pixel readout architecture 500 in accordance with the present invention. This architecture has two components—the circuitry in the pixel 550 and the circuitry in the column readout 504. This combination of these components permits a fully differentiated column sampling and readout. As noted, the column readout circuit 504 includes a reference circuit 540 acting as a "dummy" pixel, a sample and hold circuit 538, an amplifier 534 and three bias sources (e.g., pbias current circuit 575, tail current bias transistor 578, and CMF current bias transistor 580).

The pixel 550 is different from the prior art 3T pixel described in connection with FIG. 1 in that a capacitor 551 is added and the architecture is rearranged. The exemplary pixel cell 550 forms a 3T APS, which has a photodiode 562, a reset transistor 584, a source follower transistor 586, a row select transistor 588 and the capacitor 551. Photodiode 562 is coupled to Node A and Node A is coupled to the gate of source follower transistor 586. A source/drain region of a source follower transistor 586 is coupled through conductive line 572 to tail current bias transistor 578 and a CMF current bias transistor 580. The other source/drain region of source follower transistor 586 is coupled a source/drain of row selection transistor 588. The other source/drain region of row selection transistor 588 is coupled to a column line 570. Node A is also coupled to a source/drain region of a reset transistor 584 and the other source/drain of reset transistor 584 is coupled between row selection transistor 588 and the source follower transistor 586. Capacitor 551 is coupled on one side to Node A and on the other side to the interconnection of row selection transistor 588 and source follower transistor 586.

Reference circuit 540 within the column readout circuit 504 is a similar circuit to the pixel 550 but lacks a photodiode 562. The reference circuit 540 consists of a (second) Node A' coupled to the gate of source follower transistor 546. A source/drain region of a source follower transistor 546 is coupled to tail bias current transistor 578 and CMF current bias transistor 580 and the other source/drain region is coupled a source/drain of reference circuit selection transistor 548. The other source/drain region of reference circuit selection transistor 548 is coupled to pbais circuit 575. Node A' is also coupled to a source/drain region of a reset transistor 544 and the other source/drain of reset transistor 544 is coupled between row selection transistor 548 and the source follower transistor 546. Capacitor 541 is coupled on one side to Node A' and on the other side to the connection between source follower transistor 546 and reset transistor 544.

Coupled in between pixel 550 and the reference circuit 540 is the pbiasing circuit 575, which consists of Vdd coupled in between a pair of pbias transistors 574, 576.

In this embodiment, the sample and hold circuit 538 is capable of sampling and holding two sets of signals simultaneously, e.g., two reset signals and two photo signals, one photo and one comparison signal, respectively, from a desired pixel and the reference circuit, and then subsequently combining the two sets of signals. For example, a reset signal of the desired pixel 550 is sampled and stored on capacitor 514 and at the same time a reset signal of the reference circuit 540 is stored on capacitor 518. Similarly, the charge accumulated photo signal of the desired pixel 550 is sampled and stored on capacitor 516 and at the same time a comparison signal for the reference circuit 540 is sampled and stored on capacitor 520.

The sample and hold circuit 538 has a first signal input line 554 which is switchably coupled through respective SHR switch 506 and SHS switch 508 to a first side of respective capacitors 514, 516. The other side of capacitors 514, 516 are switchably coupled through respective switch 526, 528 to a first and second input to amplifier 534. The sample and hold circuit 538 has a second signal input line 556 which is switchably coupled through respective SHR switch 510 and SHS switch 512 to a first side of respective capacitors 518, 520. The other side of respective capacitors 518, 520 is respectively coupled between the other side of capacitors 514, 516 and respective switches 526, 528.

A first crowbar switchably couples through a switch 522 the conductive line between the SHR switch 506 and capacitor 514 to the conductive line between the SHR switch 510 and capacitor 518. A second crowbar switchably couples through a switch 524 the conductive line between the SHS switch 508 and capacitor 516 to the conductive line between the SHS switch 512 and capacitor 520. A Vclamp voltage is switchably coupled through a switch 532 to the conductive line between the capacitor 514 and the switch 526. A Vclamp voltage is also switchably coupled through a switch 530 to the conductive line between the capacitor 516 and the switch 528. The first signal input line 554 to the sample and hold circuit 538 is coupled to the connection between the pbiasing circuit 575 and the pixel array 502. The second signal input line 556 to the sample and hold circuit 538 is coupled to the column line 570 in the reference circuit 540 between the reference selection transistor 548 and the source follower transistor 546.

Figure 6:
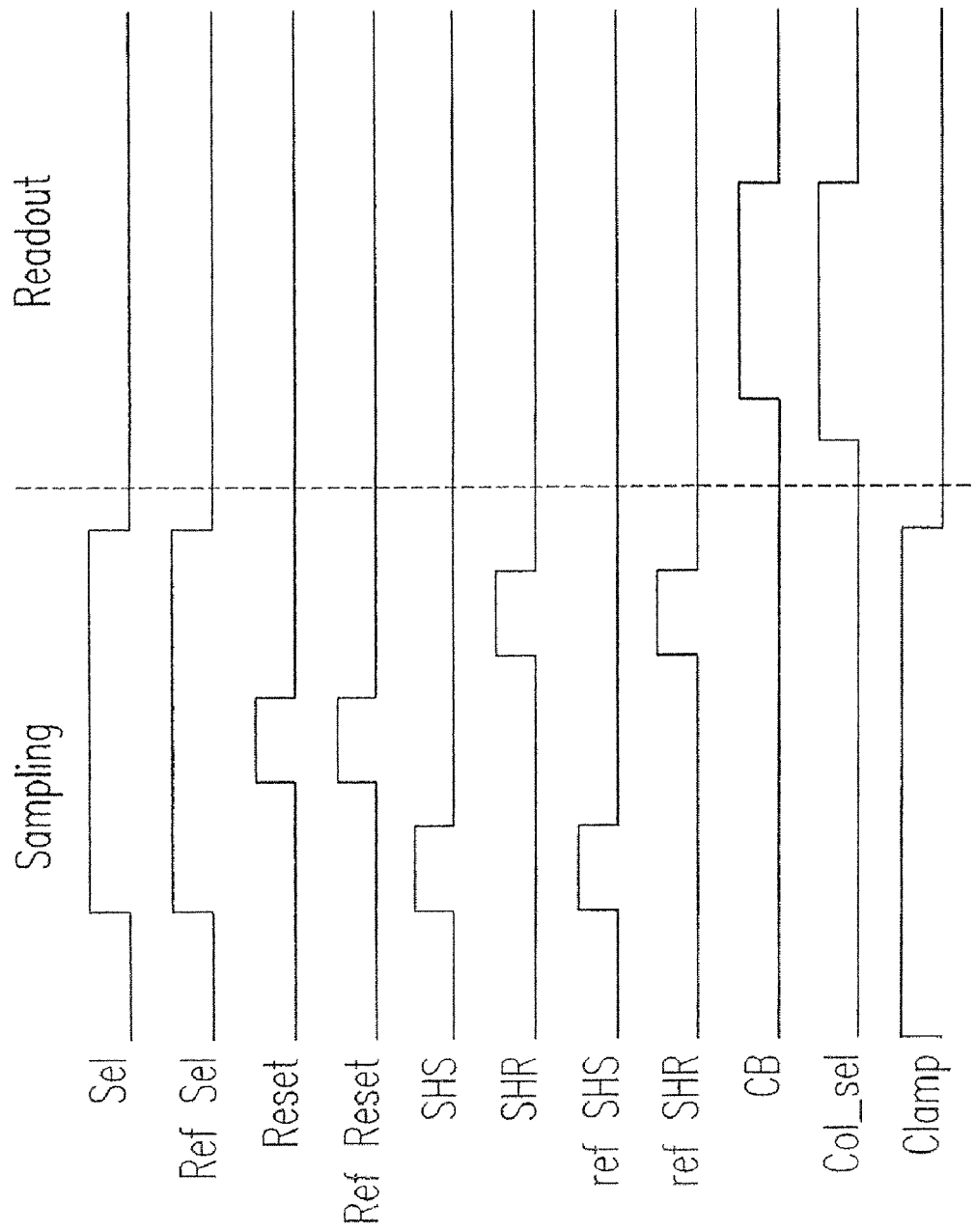
FIG. 6 is a simplified timing diagram associated with the circuitry of FIG. 5.

The operation of the FIG. 5 circuits is now described with reference to the simplified signal timing diagram of FIG. 6. Switches 530, 532 are first pulsed, by pulse Clamp, thereby temporarily coupling Vclamp to the backside of capacitors 514, 516, 518, and 520, and placing an initial charge on them. The row selection transistor 588, the reference circuit selection transistor 548, and SHS switches 508, 512 are then pulsed on by pulses Sel, Ref Sel, and SHS. The desired pixel 550 and reference circuit 540 signal voltages are sampled by a sample and hold circuit 538 connected to the column line 570. SHS switches 508, 512 are then disabled. Thus, Vsig of the pixel 550 is sampled and stored on capacitor 516, and the Vsig of the reference circuit 540 is sampled and stored on capacitor 520. The reset transistors 584, 544 are temporarily enabled by pulses Reset, Ref Reset. A pulse SHR temporarily enables SHR switches 506, 510. Pulses Sel, Ref Sel are also applied enabling the row selection transistor 588 and the reference circuit selection transistor 548. Thus, Vrst of the desired pixel 550 is sampled and stored on capacitor 514 and Vrst of the reference circuit 540 is sampled and stored on capacitor 518. Capacitor 516 connected to the pixel 550 stores the signal voltage of the pixel 550 at the same time capacitor 520 connected to the reference circuit 540 stores the comparison signal of the reference circuit 540. Additionally, capacitor 514 connected to the pixel 550 stores the reset signal voltage of the pixel 550 at the same time capacitor 518 connected to the reference circuit 540 stores the reset signal of the reference circuit 540.

In order to read out the stored signals of the pixel 550 and reference circuit 540 from the capacitors 514, 516, 518, and 520, pulses Col Sel, CB signal are applied temporarily closing Col. Select switches 526, 528 and crowbar switches 522, 524 and thereby coupling capacitors 514, 518 with a first signal input line to differential amplifier 534 and coupling capacitors 516, 520 with a second signal input line to differential amplifier 534. Amplifier 534 outputs the resulting differential signals.

In this manner four sampled signals, Vsig(desired pixel), Vsig(reference circuit), Vrst(desired pixel) and Vrst(reference circuit), are sampled and stored on respective capacitors 514, 516, 518, and 520. By sampling Vsig(reference circuit) at the same time as sampling Vsig(desired pixel), Vsig(reference circuit) is used to subtract out the noise in Vsig(desired pixel). Similarly, by sampling Vrst(reference circuit) at the same time as sampling Vrst(desired pixel), Vrst(reference circuit) is used to subtract out the noise in Vrst(desired pixel). These stored signals are then combined to provide:

$$V\text{diff}=(V\text{sig(pixel)}-V\text{sig(reference)})-(V\text{rst(pixel)}-V\text{rst(reference)}). \quad (5)$$

where this fully differentiated charge output Vdiff of amplifier 534 is free of common noise.

It should be understood that while FIG. 5 shows the circuitry for operation of a single pixel, that in practical use there will be an M times N array of pixels arranged in rows and columns.

Figure 7:
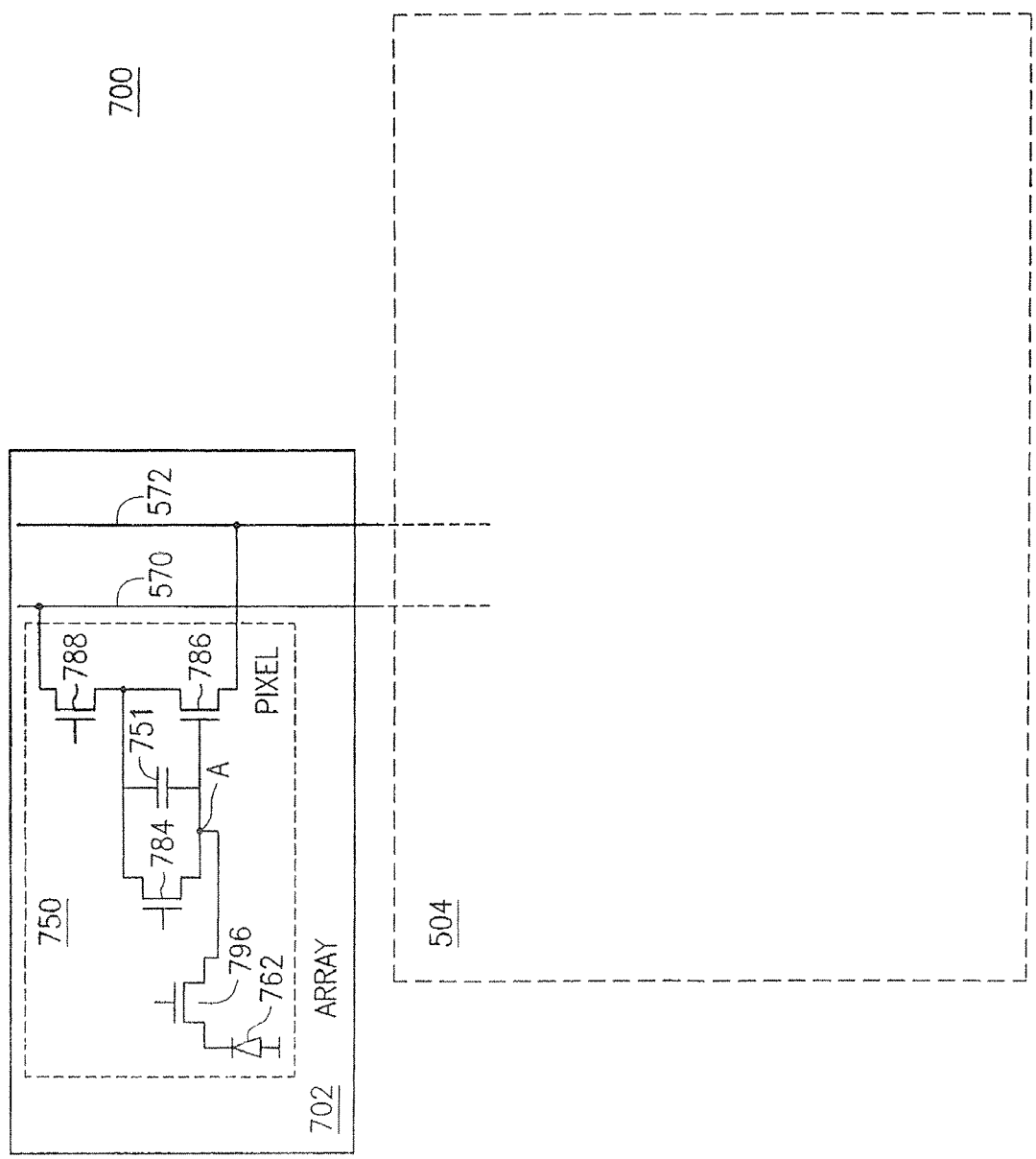
FIG. 7 is a differential readout pixel circuit and associated column readout circuitry in accordance with an another exemplary embodiment of the invention.

FIG. 7 illustrates another exemplary embodiment of a fully differential pixel readout architecture 700 of the present invention. The FIG. 7 differential pixel readout architecture 700 differs from the differential pixel readout architecture 500 of FIG. 5 in that a modified 4T pixel 750 is used in place of the 3T pixel 550 of FIG. 5. Therefore, the only difference in the circuitry between the two architectures 500, 700 is a transfer control transistor 796 between the photodiode 762 and Node A of the desired pixel 750 which is operated at the end of the charge integration period to transfer the accumulated charge at photodiode 762 to node A.

Figure 8:
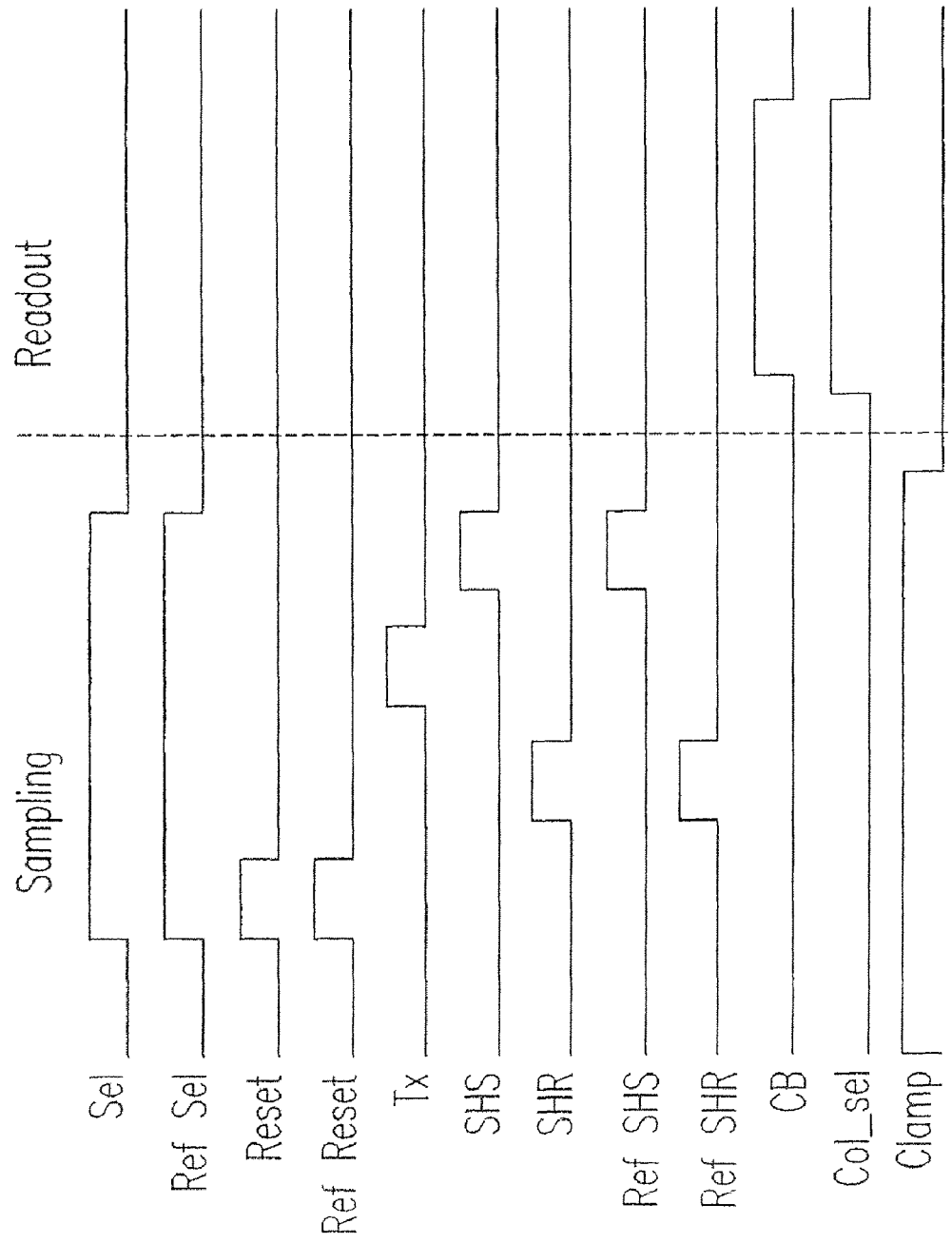
FIG. 8 is a simplified timing diagram associated with the circuitry of FIG. 7.

The operation of pixel readout architecture 700 is similar to the operation of pixel readout architecture 500 except that transfer transistor 796 gets activated to couple the photodiode 762 to Node A. An additional difference is that order of reading charge integrated and resets signals from a desired 4T pixel 750 is reversed from the order of reading from a desired 3T pixel 550. FIG. 8 provides simplified signal timing diagram for the method of operating pixel readout architecture 700.

Figure 9:
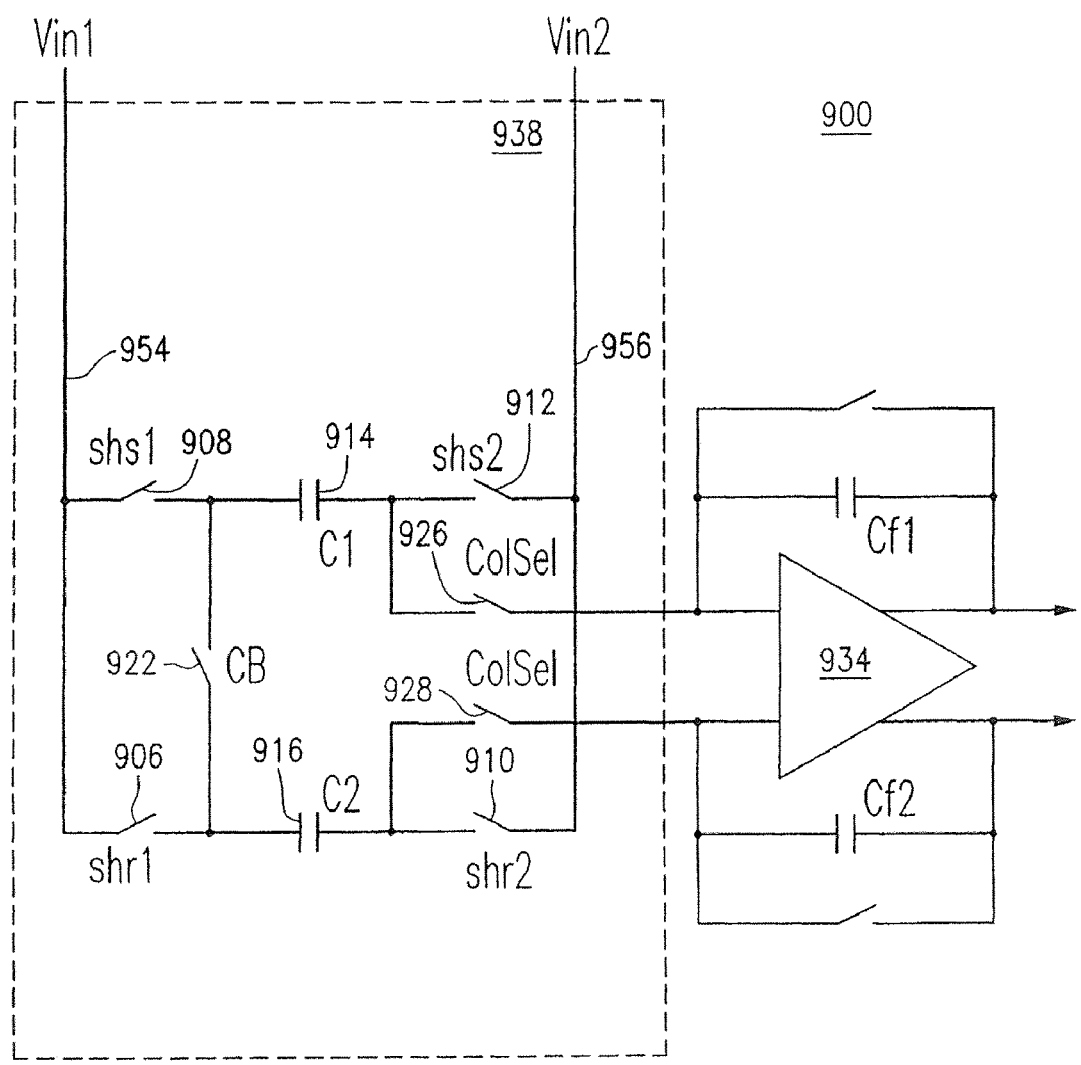
FIG. 9 is a differential column readout circuit in accordance with another exemplary embodiment of the invention.

FIG. 9 illustrates another exemplary embodiment of a differential column storage and readout circuit 900 of the present invention. FIG. 9 is a more generalized sample and hold circuit which can be used with a desired pixel and a reference circuit from elsewhere to eliminate noise in the desired pixel signal, where the desired pixel signals Vsig and Vrst enter on input line Vin1 and the reference circuit signals Vsig and Vrst enter on input line Vin2.

Sample and hold circuit 938 stores each pair of signals on a capacitor. For example, the Vsig of the desired pixel and the Vsig of the reference circuit are stored on C1 capacitor 914 and Vrst of the desired pixel and Vrst of the reference circuit are stored on C2 capacitor 916. In this way the charge on the first capacitor is $$C1=(V\text{sig1}-V\text{sig2}) \quad (6)$$

and the charge on the second capacitor is $$C2=(V\text{rst1}-V\text{rst2}). \quad (7)$$

Consequently, the readout charge injected into the amplifier 934 is:

$$V\text{diff}=((V\text{sig1}-V\text{sig2})-(V\text{rst1}-V\text{rst2})) \quad (8)$$

The differential output of the amplifier provides elimination of a noise component in the difference signal Vdiff derived from substrate and ground noise which is common to the desired pixel and reference circuit.

The sample and hold circuit 938 has a first signal input line 954 from a first signal source which is switchably coupled through respective shr1 reset sample switch 906 and shs1 signal sample switch 908 to a first side of respective C2 capacitor 916, C1 capacitor 914. The sample and hold circuit 938 has a second signal input line 956 from a second signal source which is switchably coupled through respective shr2 reset sample switch 910 and shs2 signal sample switch 912 to a second side of respective capacitors 916, 914. The second side of capacitor 914 is switchably coupled to a first input to amplifier 934 through column select switch 926. The second side of capacitor 916 is switchably coupled to a second input to amplifier 934 through column select switch 928.

Although amplifier 934 is shown in FIG. 9 in proximity to the column sample and hold circuit 938, amplifier 934 may be globally accessible and therefore implemented outside of the column readout circuit 900. In another aspect of the invention, column readout circuit 900 includes amplifier 934.

A crowbar switchably couples through a switch 922 the conductive line between the shr1 reset sample switch 906 and capacitor 916 to the conductive line between the shs1 signal sample switch 908 and capacitor 914.

Figure 10:
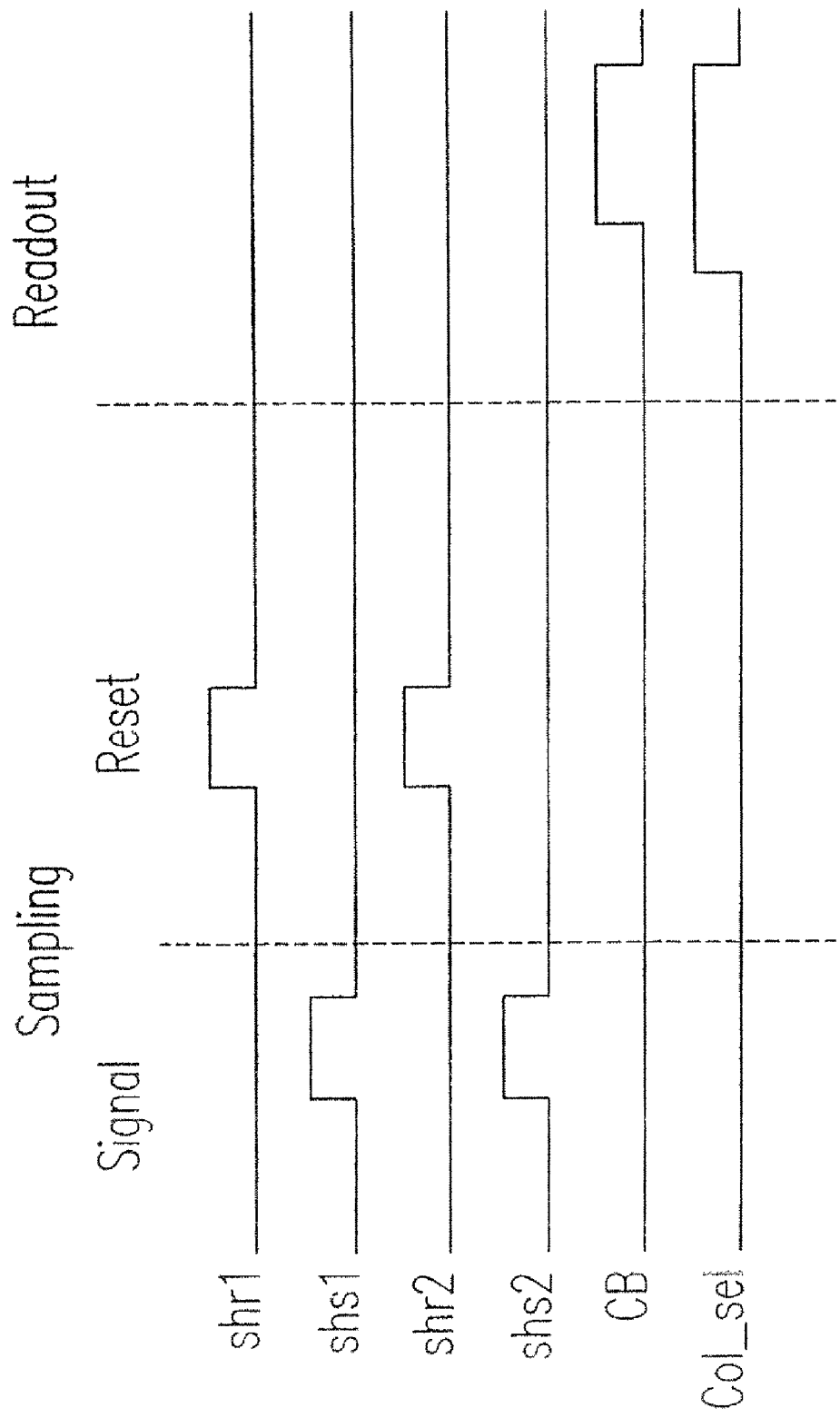
FIG. 10 is a simplified timing diagram associated with the circuitry of FIG. 9.

The operation of circuit 938 is now described with reference to the simplified signal timing diagram of FIG. 10 (implementing a read out from a 3T pixel).

The shs1 signal sample switch 908 and shs2 signal sample switch 912 are temporarily enabled by pulses shs1, shs2 and are then disabled. Thus, Vsig of a desired pixel and Vsig of a reference circuit are sampled and stored on capacitor 914. Pulses shr1, shr2 are applied temporarily enabling the shr1 reset sample switch 906 and shr2 reset sample switch 910. Thus, Vrst of a desired pixel and Vrst of a reference circuit are sampled and stored on capacitor 916. Thus, capacitor 914 stores the signal voltage of the desired pixel at the same time it stores the signal of the reference circuit. Additionally, capacitor 916 stores the reset signal voltage of a desired pixel at the same time it stores the reset signal of a reference circuit.

In order to read out the stored signals of a desired pixel and reference circuit from the capacitors 914, 916, a pulse signal is applied temporarily closing Col. Select switches 926, 928.

Crowbar switch 922 is pulsed thereby forcing signals on capacitors 914, 916 through differential amplifier 934. Amplifier 934 outputs the resulting differential signals, thereby providing a fully differential output in which common source noise is eliminated from the desired pixel output signal.

Figure 11:
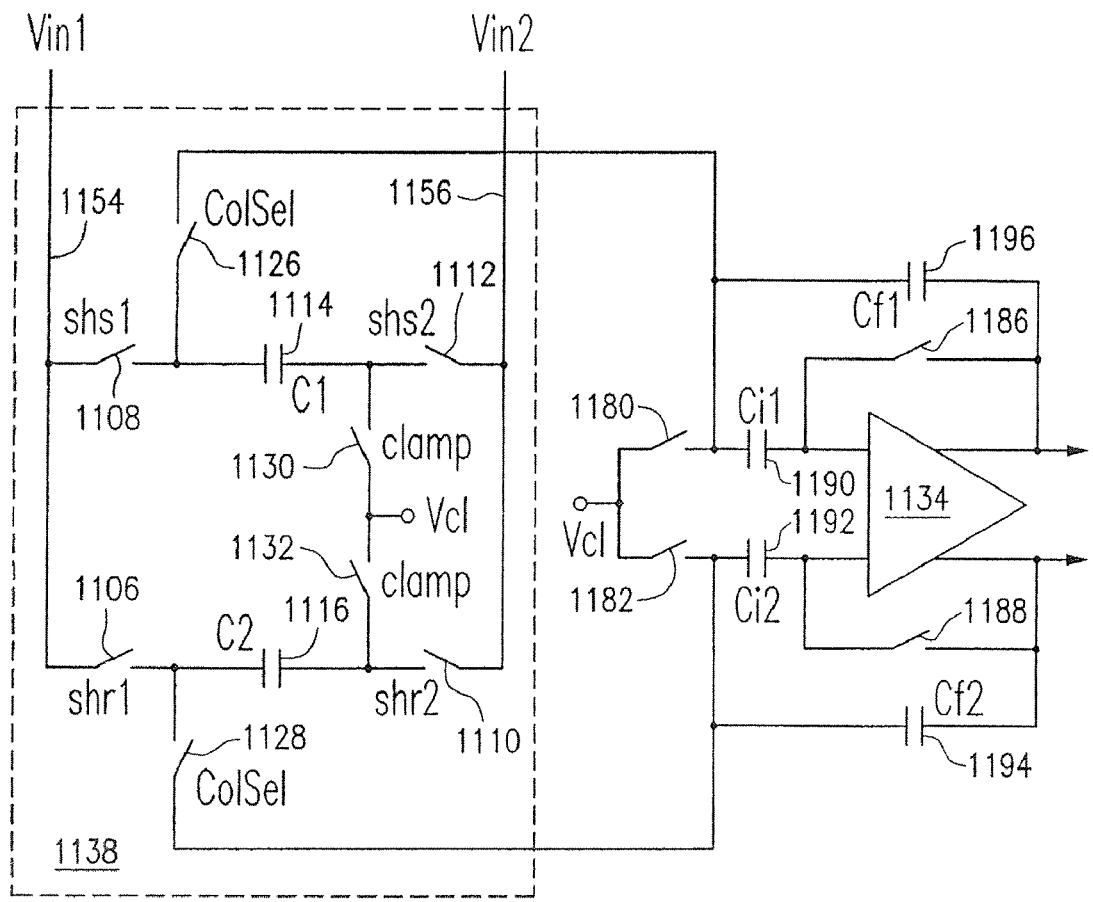
FIG. 11 is a differential column readout circuit in accordance with another exemplary embodiment of the invention.

FIG. 11 illustrates another exemplary embodiment of a differential column storage and readout circuit 1100 of the present invention. The FIG. 11 is similar to the FIG. 9 circuit, but circuit 1100 does not use the crowbar circuit 922 (FIG. 9).

The sample and hold circuit 1138 has a first signal input line 1154 from a first signal source which carries the Vsig and Vrst signals of the desired pixel. The first input line 1154 is switchably coupled through respective shr1 reset sample switch 1106 and shs1 signal sample switch 1108 to a first side of respective capacitors 1116, 1114. The sample and hold circuit 1138 has a second signal input line 1156 from a second signal source which carries the Vsig and Vrst signals of the reference circuit. The second signal input line 1156 is switchably coupled through respective shr2 reset sample switch 1110 and shs2 signal sample switch 1112 to a second side of respective capacitors 1116, 1114.

A Vclamp voltage is switchably coupled through a shs2 signal sample switch 1130 to the conductive line between the capacitor 1114 and the switch 1112. A Vclamp voltage is also switchably coupled through a shr2 reset sample switch 1132 to the conductive line between the capacitor 1116 and the switch 1110. The clamp voltage is used to precharge the capacitors 1116, 1114 before sampling.

The first side of capacitor 1114 is switchably coupled to a first side of a capacitor 1190 through column select switch 1126. The back side of capacitor 1190 is coupled to the first input of amplifier 1134. A Vclamp voltage is switchably coupled through a switch 1180 to the first side of capacitor 1190. The conductive line between the switch 1126 and capacitor 1190 is coupled through a capacitor 1196 to the first output of the amplifier 11134. The conductive line between capacitor 1190 and amplifier 1134 is switchably coupled through switch 1186 to the conductive line between capacitor 1196 and the first output of amplifier 1134.

The first side of capacitor 1116 is switchably coupled to a first side of a capacitor 1192 through column select switch 1128. The back side of capacitor 1192 is coupled to the second input of amplifier 1134. A Vclamp voltage is switchably coupled through a switch 1182 to the first side of capacitor 1192. The conductive line between the switch 1128 and capacitor 1192 is coupled through a capacitor 1194 to the second output of the amplifier 1134. The conductive line between capacitor 1192 and amplifier 1134 is switchably coupled through switch 1188 to the conductive line between capacitor 1194 and the second output of amplifier 1134.

Figure 12:
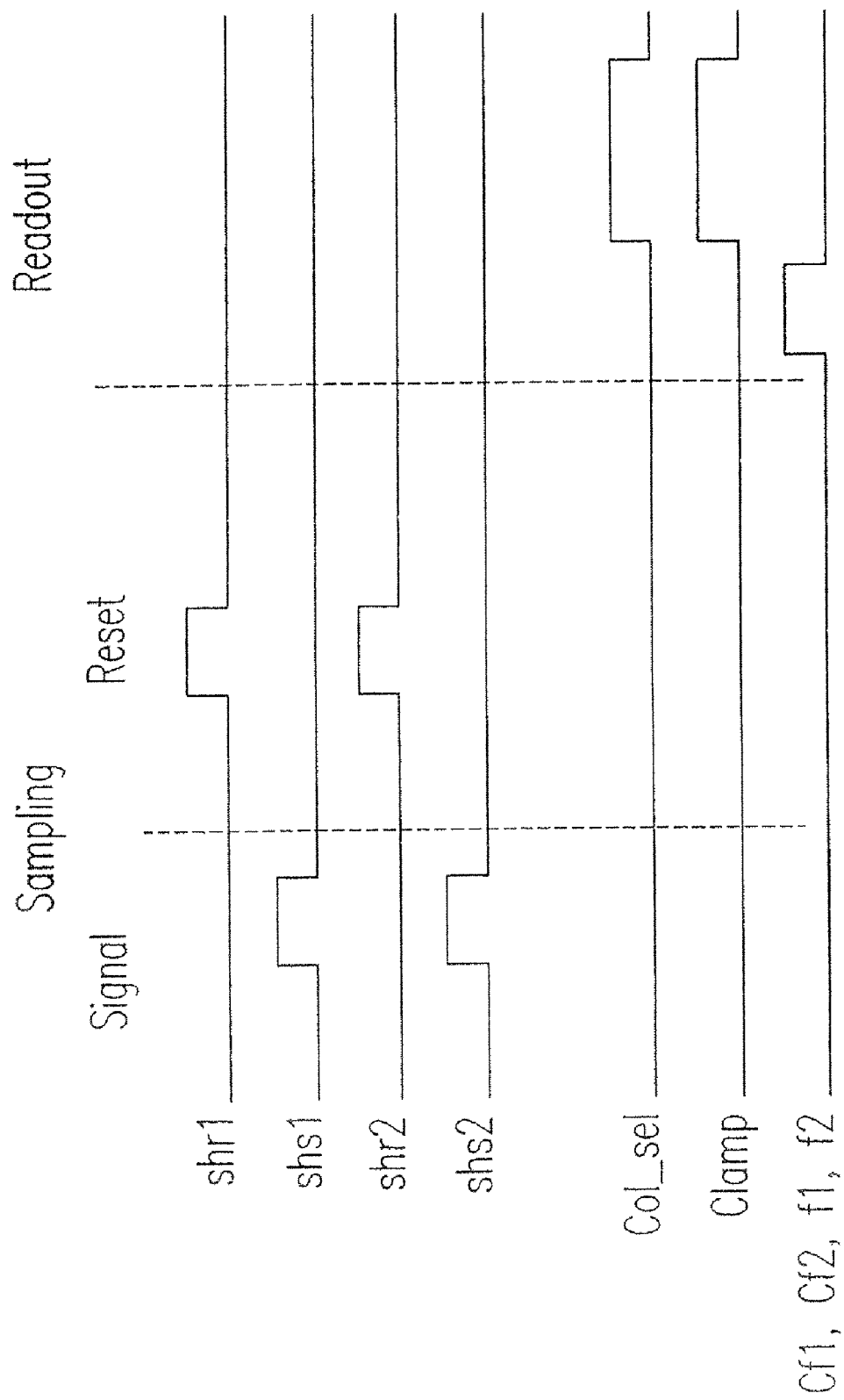
FIG. 12 is a simplified timing diagram associated with the circuitry of FIG. 11.

The operation of circuit 1138 is now described with reference to the simplified signal timing diagram of FIG. 12 (implementing a read out from a 3T pixel).

The shs1 signal sample switch 1108 and shs2 signal sample switch 1112 are pulsed by pulses shs1, shs2. Thus, Vsig of a pixel and Vsig of a reference circuit are sampled and stored on capacitor 1114. Pulses shr1, shr2 are applied enabling shr1 reset sample switch 1106 and shr2 reset sample switch 1110. Thus, Vrst of a pixel and Vrst of a reference circuit are sampled and stored on capacitor 1116. Capacitor 1114 stores the signal voltage of the pixel at the same time it stores the signal of the reference circuit. Additionally, capacitor 1116 stores the reset signal voltage of the pixel at the same time it stores the reset signal of a reference circuit.

In order to read out the stored signals, the amplifier 1134 is reset. Therefore pulses Cf1, Cf2, f1, f2 are sent temporarily enabling switches 1180, 1182, 1186, and 1188. To read the stored signals of a pixel and reference circuit from the capacitors 1114, 1116, a pulse Clamp is applied to switches 1130, 1132 temporarily coupling Vclamp to the capacitors 1114, 1116. A pulse Col_Sel signal is sent temporarily closing Col. Select switches 1126, 1128 thereby forcing the signals on capacitors 1114, 1116 through differential amplifier 1134. Amplifier 1134 outputs the resulting differential signals, thereby providing a fully differential output in which common source noise is eliminated from the desired output signal.

Figure 13:
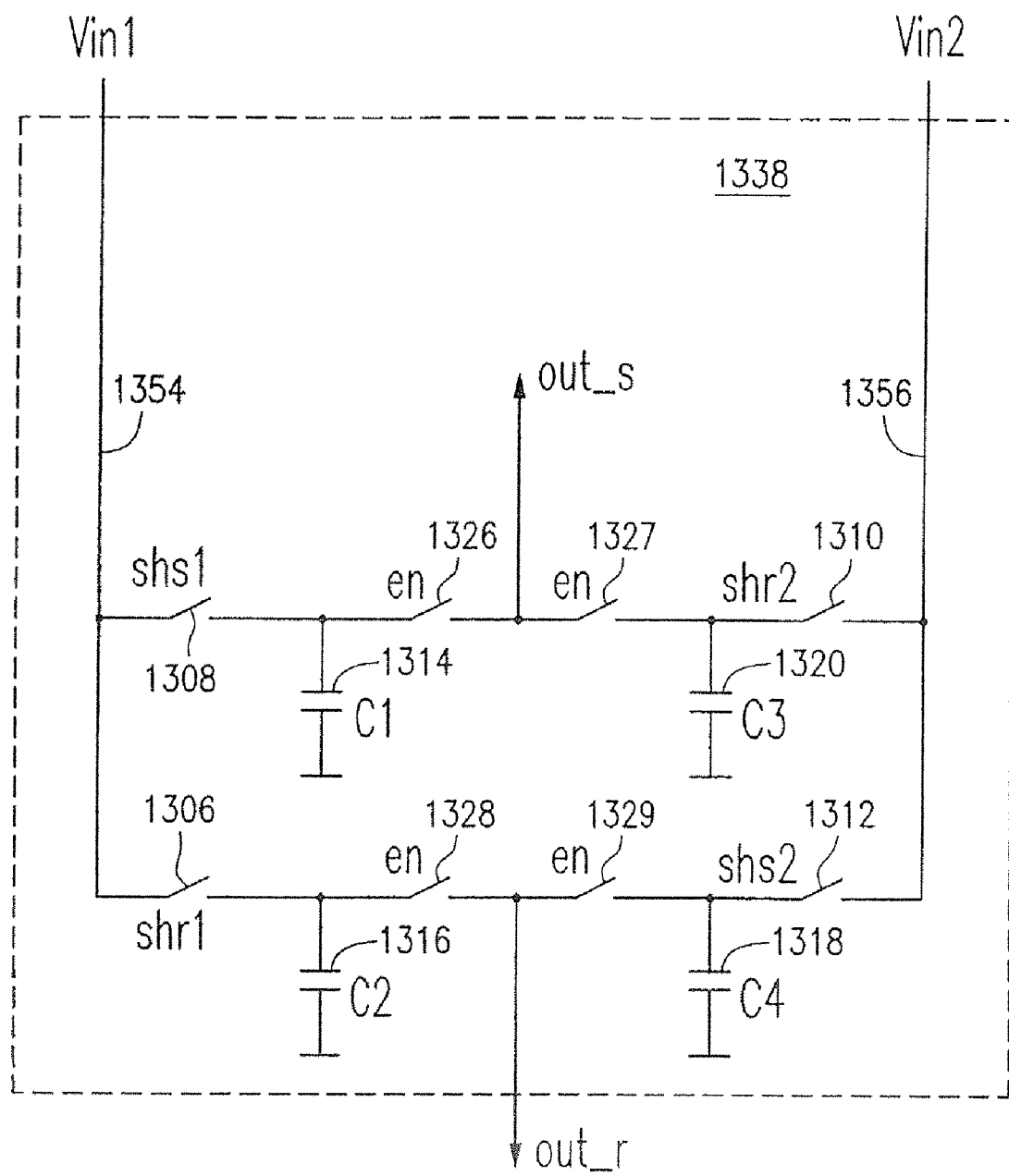
FIG. 13 is a differential column readout circuit in accordance with another exemplary embodiment of the invention.

FIG. 13 illustrates another exemplary embodiment of a differential column storage and readout circuit 1300 of the present invention.

The architecture of circuit 1300 is similar to that of circuit 900 in FIG. 9, in that circuit 1300 reads in two pairs of voltages and stores them on four respective capacitors, 1314, 1316, 1318, and 1320. However, circuit 1300 combines signals that are mixed to eliminate noise between two pairs of signals prior to them being input to a differential amplifier. For example, Vsig of the desired pixel is combined with the Vrst of the reference circuit, providing:

$$V\text{out1} = \tfrac{1}{2}(V\text{sig(pixel)} + V\text{rst(reference)}). \quad (9)$$

Vrst of the desired pixel is combined with the Vsig of the reference circuit, providing $$V\text{out2} = \tfrac{1}{2}(V\text{sig(reference)} + V\text{rst(pixel)}). \quad (10)$$

Therefore, the voltage difference can be determined using known techniques to be:

$$V\text{diff} = \tfrac{1}{2}((V\text{sig(pixel)} - V\text{rst(pixel)}) - (V\text{sig(reference)} - V\text{rst(reference)})). \quad (11)$$

Sample and hold circuit 1338 stores each signal of the two pairs of signals on a respective capacitor 1314, 1316, 1318, and 1320. For example, the Vsig of the desired pixel and the Vsig of the reference circuit are stored on a respective capacitor 1314, 1318 and the Vrst of the desired pixel and the Vrst of the reference circuit are stored on a respective capacitor 1316, 1320. The differential output of the amplifier provides elimination of a common noise component derived from substrate and ground noise.

The sample and hold circuit 1338 has a first signal input line 1354 from a first signal source which is switchably coupled through respective shr1 reset sample switch 1306 and shs1 signal sample switch 1308 to a first side of respective capacitors 1316, 1314. The second side of capacitors 1316, 1314 are coupled to ground. The sample and hold circuit 1338 has a second signal input line 1356 from a second signal source which is switchably coupled through respective shr2 reset sample switch 1310 and shs2 signal sample switch 1312 to a second side of respective capacitors 1320, 1318. The other side of respective capacitors 1320, 1318 are coupled to ground.

The first side of capacitors 1314, 1320 are switchably coupled to a first signal input line to a downstream amplifier through respective switches 1326, 1327. The first side of capacitors 1316, 1318 are switchably coupled to a second signal input line to a downstream amplifier through respective switches 1328, 1329.

Figure 14:
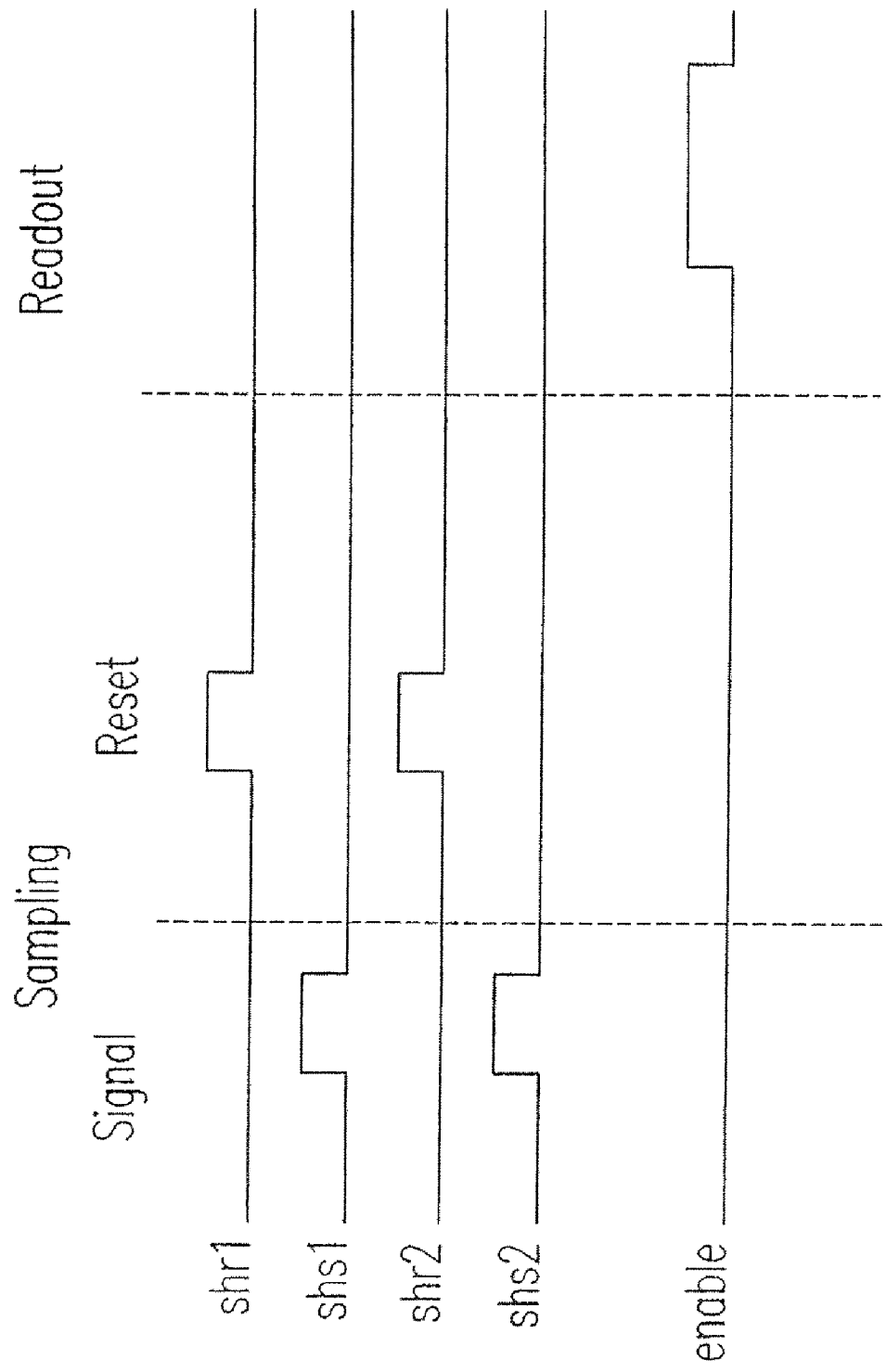
FIG. 14 is a simplified timing diagram associated with the circuitry of FIG. 13.

The operation of circuit 1338 is now described with reference to the simplified signal timing diagram of FIG. 14 (implementing a read from a 3T pixel).

The shs1 signal sample switch 1308 and shs2 signal sample switch 1312 are temporarily enabled with pulses shs1, shs2 signals. Thus, Vsig of a desired pixel and Vsig of a reference circuit are sampled and stored on respective capacitors 1314, 1318. Pulses shr1, shr2 are applied temporarily enabling shr1 reset sample switch 1306 and shr2 reset sample switch 1310. Thus, Vrst of a desired pixel and Vrst of a reference circuit are sampled and stored on respective capacitors 1316, 1320. Capacitor 1314 stores the signal voltage of a desired pixel at the same time it stores the signal of the reference circuit on capacitor 1318. Additionally, capacitor 1316 stores the reset signal voltage of a desired pixel at the same time the reset signal of a reference circuit is stored on capacitor 1320.

To read out the stored signals from the capacitors 1314, 1320 an enable pulse signal is applied temporarily closing switches 1326, 1327 thereby forcing the signals stored on capacitors 1314, 1320 through a first input of a downstream amplifier. The enable pulse signal is also applied to and closes switches 1328, 1329 thereby forcing the signals stored on capacitors 1316, 1318 through a second input of a downstream amplifier. The amplifier outputs the resulting differential signals, thereby providing a fully differential output in which common source noise is eliminated from the desired output signal.

Figure 15:
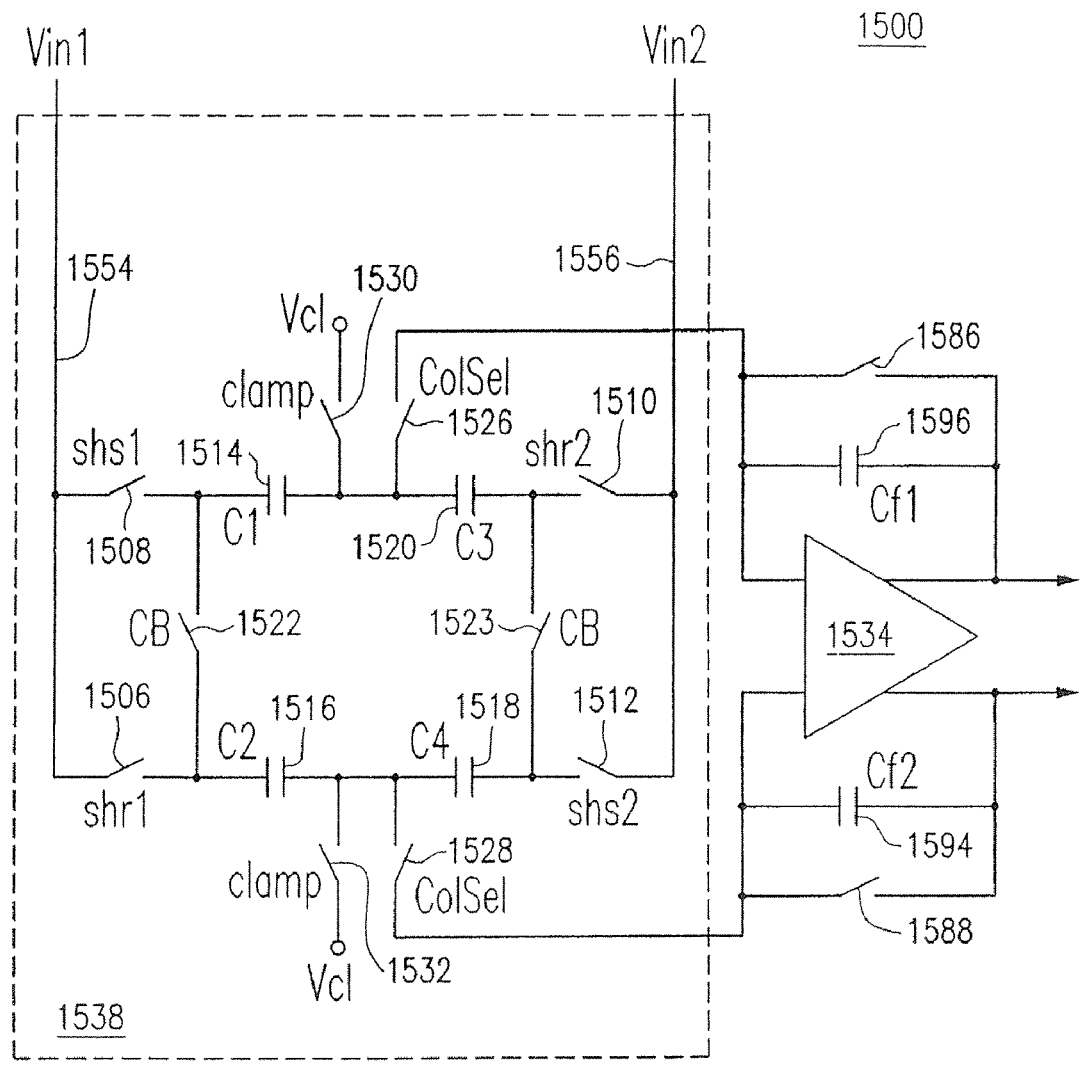
FIG. 15 is a differential column readout circuit in accordance with another exemplary embodiment of the invention.

FIG. 15 illustrates another exemplary embodiment of a differential column storage and readout circuit 1500 of the present invention. Sample and hold circuit 1538 reads in two pairs of signals, e.g., Vsig(pixel), Vrst(pixel), Vsig(reference), and Vrst(reference), and stores them on four respective capacitors 1514, 1516, 1518, and 1520. The sample and hold circuit 1538 combines mixed signals to eliminate common noise between two pairs of signals prior to being input into the downstream amplifier 1534. For example, Vsig of the desired pixel is combined with Vrst of the reference circuit and the input into the first input of an amplifier. Vrst of the desired pixel is combined with Vsig of the reference circuit and input into the second input of an amplifier.

The sample and hold circuit 1538 has a first signal input line 1554 from a first signal source which is switchably coupled through respective shr1 reset sample switch 1506 and shs1 signal sample switch 1508 to a first side of respective capacitors 1516, 1514. The sample and hold circuit 1538 has a second signal input line 1556 from a second signal source which is switchably coupled through respective shr2 reset sample switch 1510 and shs2 signal sample switch 1512 to a first side of respective capacitors 1520, 1518. The back side of respective capacitors 1520, 1514 are switchably coupled to a first signal input line of amplifier 1534 through column select switch 1526. The back side of respective capacitors 1518, 1516 are switchably coupled to a second signal input line of amplifier 1534 through column select switch 1528. Signal line 1554 is coupled to a desired pixel while signal line 1556 is coupled to a reference circuit.

A crowbar switchably couples through a switch 1522 the conductive line between the shr1 reset sample switch 1506 and capacitor 1516 to the conductive line between the shs1 signal sample switch 1508 and capacitor 1514. A second crowbar switchably couples through a switch 1523 the conductive line between the shr2 reset sample switch 1510 and capacitor 1520 to the conductive line between the shs2 signal sample switch 1512 and capacitor 1518. A Vclamp voltage is switchably coupled through a switch 1530 to the connection between the capacitor 1520 and the capacitor 1514. A Vclamp voltage is also switchably coupled through a switch 1532 to the connection between capacitor 1516 and capacitor 1518. The clamp voltage is used to precharge the capacitors 1514, 1516, 1518, and 1520.

The first signal input line to the amplifier 1534, i.e., the conductive line between the column select switch 1526 and amplifier 1534, is coupled to the first output from amplifier 1534 through capacitor 1596. The first signal input line to the amplifier 1534 is also switchably coupled to the first output from amplifier 1534 through switch 1586. The second signal input line to the amplifier 1534, i.e., the conductive line between the column select switch 1528 and amplifier 1534, is coupled to the second output from amplifier 1534 through capacitor 1594. The second signal input line to the amplifier 1534 is also switchably coupled to the second output from amplifier 1534 through switch 1588.

Figure 16:
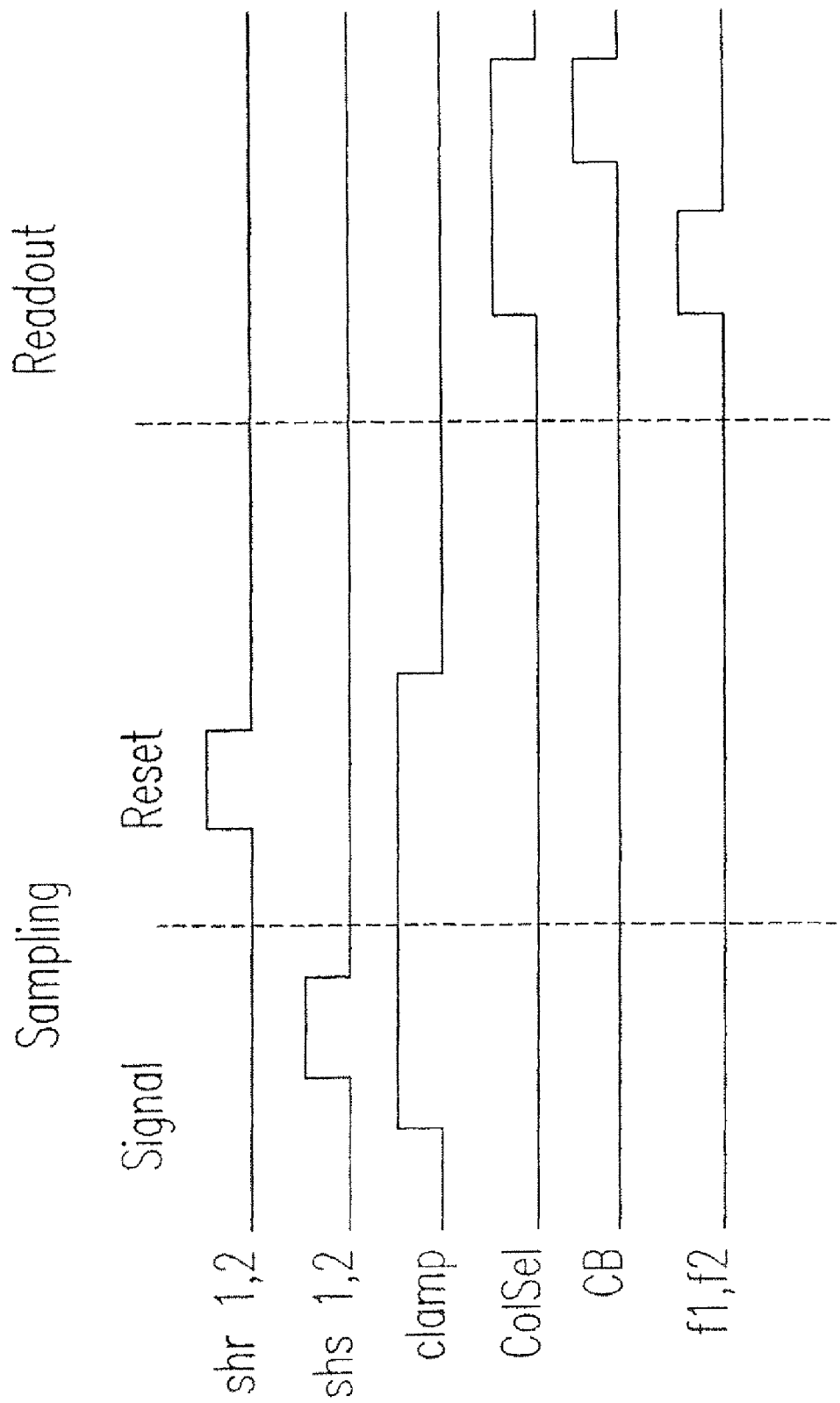
FIG. 16 is a simplified timing diagram associated with the circuitry of FIGS. 15 and 19.

The operation of circuit 1538 is now described with reference to the simplified signal timing diagram of FIG. 16 (implementing a read out from a 3T pixel).

The Vclamp switches 1508, 1506 are enabled by a pulse Clamp, thereby precharging the capacitors 1514, 1516, 1518, and 1520. The shs1 signal sample switch 1508 and shs2 signal sample switch 1512 are pulsed by pulses shs1, shs2 thereby temporarily enabling them. Thus, Vsig of a desired pixel and Vsig of a reference circuit are sampled and stored on respective capacitors 1514, 1518. Pulses shr1, shr2 are applied temporarily enabling shr1 reset sample switch 1506 and shr2 reset sample switch 1510. Thus, Vrst of a desired pixel and Vrst of a reference circuit are sampled and stored on respective capacitors 1516, 1520.

In order to read out the stored signals from the capacitors 1514, 1516, 1518, and 1520, the amplifier 1534 is reset by temporarily closing switches 1594 and 1596. A pulse ColSel signal is applied temporarily closing Col. Select switches 1526, 1528 thereby coupling capacitors 1514, 1516, 1518, and 1520 to differential amplifier 1534. Crowbar switches 1522, 1523 are pulsed by CB closed thereby forcing the stored signals in capacitors 1514, 1516, 1518, and 1520 through amplifier 1534. Amplifier 1534 outputs the resulting differential signals, thereby providing a fully differential output in which common source noise is eliminated.

Figure 17:
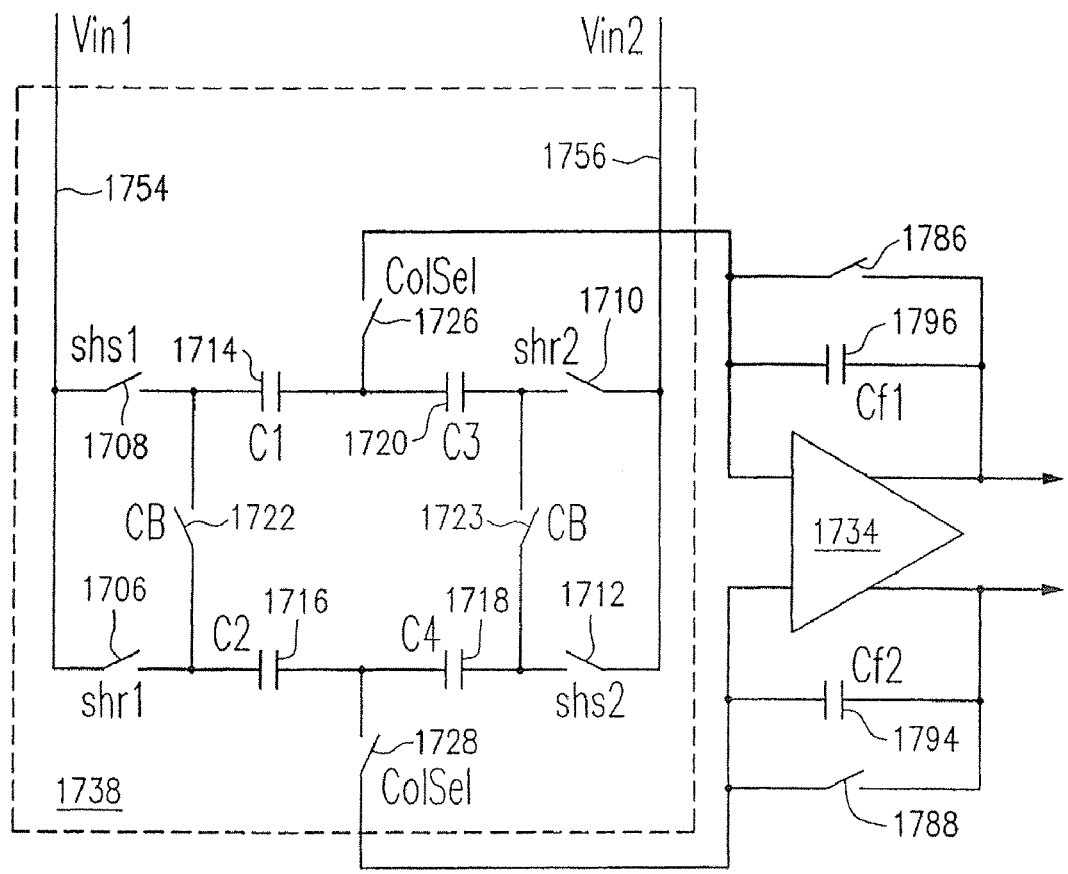
FIG. 17 is a differential column readout circuit in accordance with another exemplary embodiment of the invention.

FIG. 17 illustrates another exemplary embodiment of a differential column storage and readout circuit 1700 of the present invention. The circuit 1700 architecture is different from the column storage and readout circuit 1500 (FIG. 15) architecture in that the circuit 1700 does not include a Vclamp circuit, which alters the method of operating the circuit.

The sample and hold circuit 1738 has a first signal input line 1754 from a first signal source which is switchably coupled through respective shr1 reset sample switch 1706 and shs1 signal sample switch 1708 to first sides of respective capacitors 1716, 1714. The sample and hold circuit 1738 has a second signal input line 1756 from a second signal source which is switchably coupled through respective shr2 reset sample switch 1710 and shs2 signal sample switch 1712 to first sides of respective capacitors 1720, 1718. The back sides of respective capacitors 1720, 1714 are switchably coupled to a first signal input line of amplifier 1734 through column select switch 1726. The back sides of respective capacitors 1718, 1716 are switchably coupled to a second signal input line of amplifier 1734 through column select switch 1728. Signal input line 1754 is coupled to a desired pixel, and signal input line 1756 is coupled to a reference circuit.

A crowbar switch 1722 couples on one side the connection between shr1 reset sample switch 1706 and capacitor 1716 and on the other side the connection between shs1 signal sample switch 1708 and capacitor 1714. A second crowbar switch 1723 couples on one side the connection between shr2 reset sample switch 1710 and capacitor 1720 and on the other side the connection between shs2 signal sample switch 1712 and capacitor 1718.

The first signal input line to the amplifier 1734, i.e., the conductive line between the column select switch 1726 and amplifier 1734, is coupled to the first output from amplifier 1734 through a capacitor 1796. The first signal input line to the amplifier 1734 is also switchably coupled to the first output from amplifier 1734 through switch 1786. The second signal input line to the amplifier 1734, i.e., the conductive line between the column select switch 1728 and amplifier 1734, is coupled to the second output from amplifier 1734 through a capacitor 1794. The second signal input line to the amplifier 1734 is also switchably coupled to the second output from amplifier 1734 through switch 1788.

Figure 18:
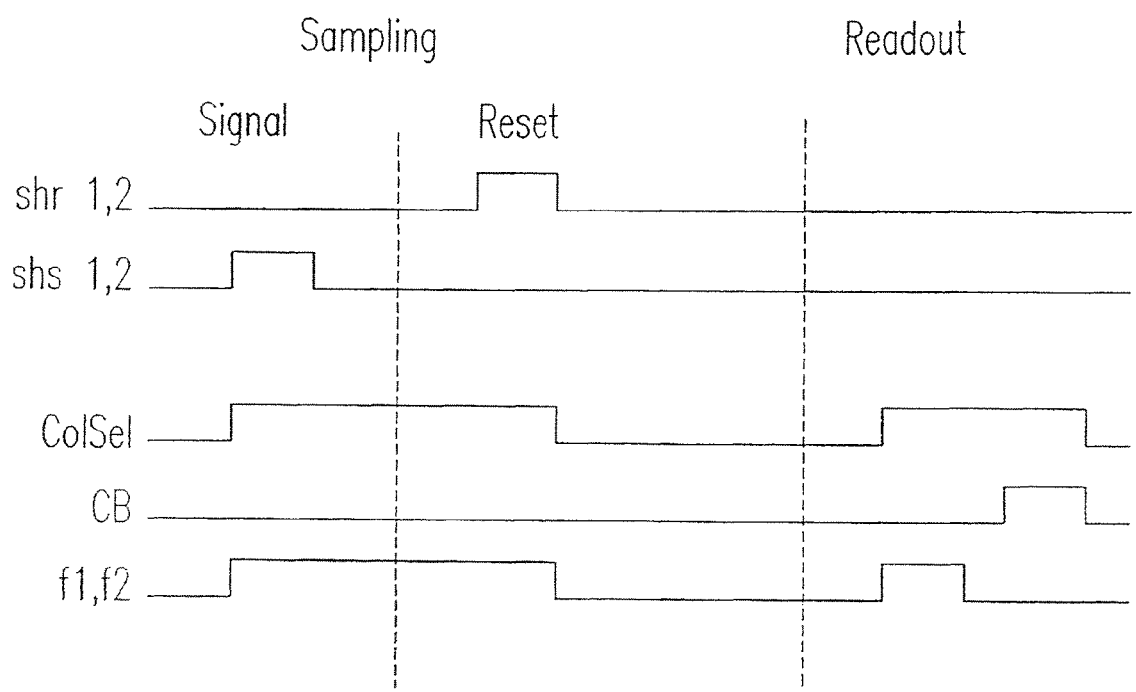
FIG. 18 is a simplified timing diagram associated with the circuitry of FIG. 17.

The operation of circuit 1738 is now described with reference to the simplified signal timing diagram of FIG. 18 (implementing a read out from a 3T pixel).

During signal samples, the switches 1788, 1786 and col. sel. switches 1728, 1726 are respectively enabled by pulses f1, f2 and col. sel. The shs1 signal sample switch 1708 and shs2 signal sample switch 1712 are pulsed by shs1, shs2, thereby enabling them. Thus, Vsig of a desired pixel and Vsig of a reference circuit are sampled and stored on respective capacitors 1714, 1718. Pulses shr1, 2 are applied enabling shr1 reset sample switch 1706 and shr2 reset sample switch 1710. Thus, Vrst of a desired pixel and Vrst of a reference circuit are sampled and stored on respective capacitors 1716, 1720. Thereafter, the pulses f1, f2, ColSel to switches 1788, 1786, 1728, and 1726 are disabled.

To read out the stored signals of a desired pixel and reference circuit from the capacitors 1714, 1716, 1718, and 1720, switches 1788, 1786 and col. sel. switches 1728, 1726 are closed by pulses f1, f2, ColSel, thereby coupling capacitors 1714, 1720 to a first signal input line of differential amplifier 1734 and coupling capacitors 1716, 1718 to a second signal input line of differential amplifier 1734. Then a pulse CB is temporarily applied closing crowbar switches 1722, 1723, thereby forcing the signals stored in the capacitors, 1714, 1716, 1718, and 1720 through amplifier 1734. Amplifier 1734 outputs the resulting differential signals, thereby providing a fully differential output in which common mode noise is eliminated from the desired pixel output signal.

Figure 19:
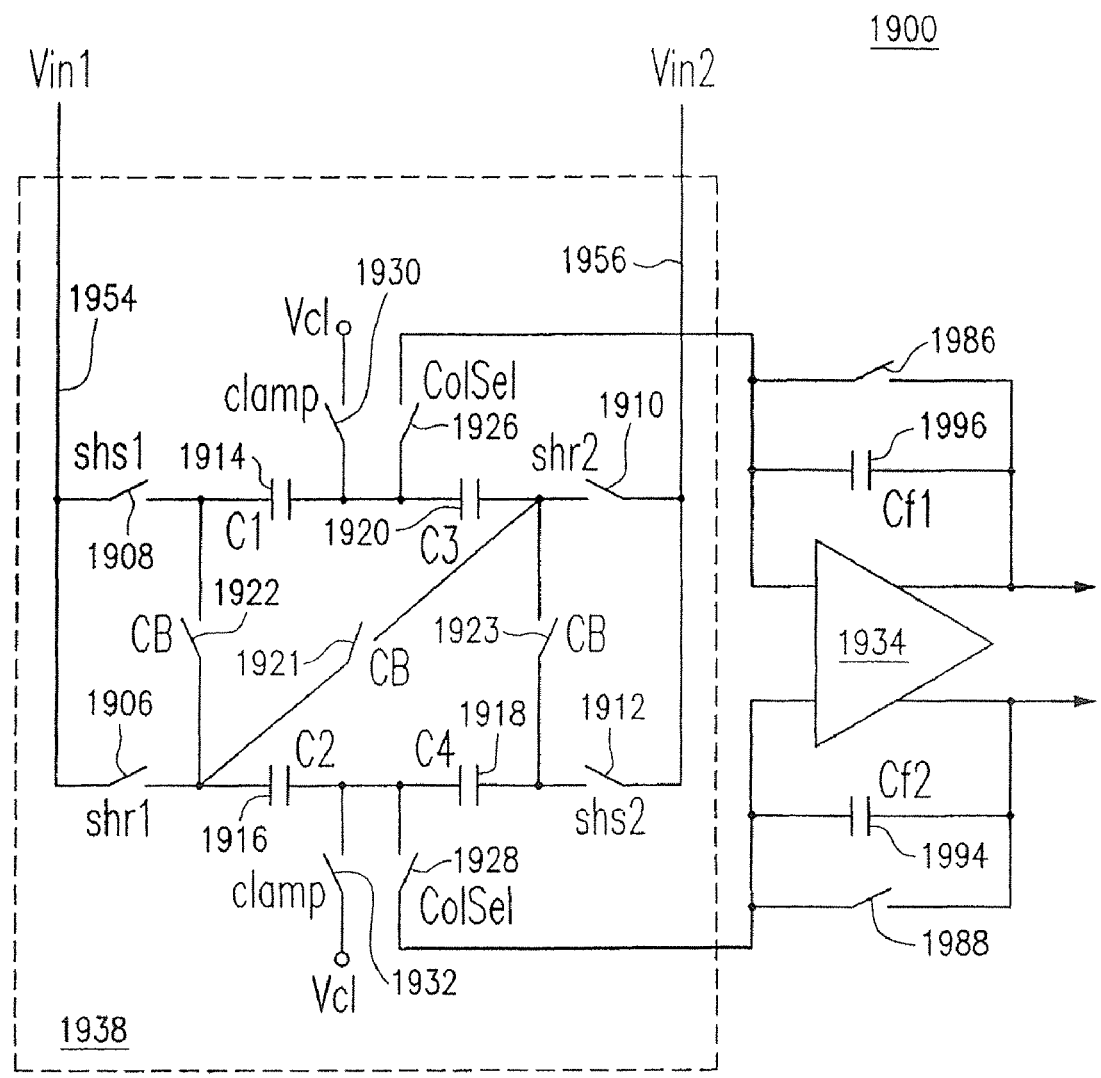
FIG. 19 is a differential column readout circuit in accordance with another exemplary embodiment of the invention.

FIG. 19 illustrates another exemplary embodiment of a differential column storage and readout circuit 1900 of the present invention. The FIG. 19 differential column storage and readout circuit 1900 is similar to the circuit 1500 of FIG. 15 but adds an additional crowbar circuit 1921.

The sample and hold circuit 1938 has a first signal input line 1954 from a first signal source which is switchably coupled through respective shr1 reset sample switch 1906 and shs1 signal sample switch 1908 to first sides of respective capacitors 1916, 1914. The sample and hold circuit 1938 has a second signal input line 1956 from a second signal source which is switchably coupled through respective shr2 reset sample switch 1910 and shs2 signal sample switch 1912 to first sides of respective capacitors 1920, 1918. The back side of respective capacitors 1920, 1914 is switchably coupled to a first signal input line of amplifier 1934 through column select switch 1926. The back side of respective capacitors 1918, 1916 is switchably coupled to a second signal input line of amplifier 1934 through column select switch 1928. Signal input line 1954 is coupled to a desired pixel, and signal input line 1956 is coupled to a reference circuit.

A crowbar switch 1922 couples on one side the connection between shr1 reset sample switch 1906 and capacitor 1916 and on the other side the connection between shs1 signal sample switch 1908 and capacitor 1914. A second crowbar switch 1923 couples on one side the connection between shr2 reset sample switch 1910 and capacitor 1920 and on the other side the connection between shs2 signal sample switch 1912 and capacitor 1918. A third crowbar switch 1921 couples on one side the connection between capacitor 1920 and switch 1910 and on the other side the connection between capacitor 1916 and switch 1906. A Vclamp voltage is switchably coupled through switch 1930 to the conductive line between the capacitor 1920 and the capacitor 1914. A Vclamp voltage is also switchably coupled through switch 1932 to the conductive line between capacitor 1916 and capacitor 1918.

The first signal input line to the amplifier 1934, i.e., the conductive line between the column select switch 1926 and amplifier 1934, is coupled to the first output from amplifier 1934 through capacitor 1996. The first signal input line to the amplifier 1934 is also switchably coupled to the first output from amplifier 1934 through switch 1986. The second signal input line to the amplifier 1934, i.e., the conductive line between the column select switch 1928 and amplifier 1934, is coupled to the second output from amplifier 1934 through capacitor 1994. The second signal input line to the amplifier 1934 is switchably coupled to the second output from amplifier 1934 through switch 1988.

The operation of circuits of is now described with reference to the simplified signal timing diagram of FIG. 16 (implementing a read from a 3T pixel).

The Vclamp switches 1908, 1906 are enabled by a pulse clamp, thereby precharging the capacitors 1914, 1916, 1918, and 1920. The shs1 signal sample switch 1908 and shs2 signal sample switch 1912 are pulsed by signals shr1, 2, thereby temporarily enabling them. Thus, Vsig of a desired pixel and Vsig of a reference circuit are sampled and stored on respective capacitors 1914, 1918. A pulse shr1, 2 is applied temporarily enabling shr1 reset sample switch 1906 and shr2 reset sample switch 1910. Thus, Vrst of a desired pixel and Vrst of a reference circuit are sampled and stored on respective capacitors 1916, 1920.

In order to read out the stored signals from the capacitors 1914, 1916, 1918, and 1920, the amplifier 1934 is reset by temporarily closing switches 1994 and 1996. A pulse ColSel signal is applied temporarily closing Col. Select switches 1926, 1928 thereby coupling capacitors 1914, 1916, 1918, and 1920 to differential amplifier 1934. Crowbar switches 1921, 1922, and 1923 are pulsed closed by signal CB thereby forcing the stored signals in capacitors 1914, 1916, 1918, and 1920 through amplifier 1934. Amplifier 1934 outputs the resulting differential signals, thereby providing a fully differential output in which the common mode noise is eliminated from the desired output signal.

Figure 20:
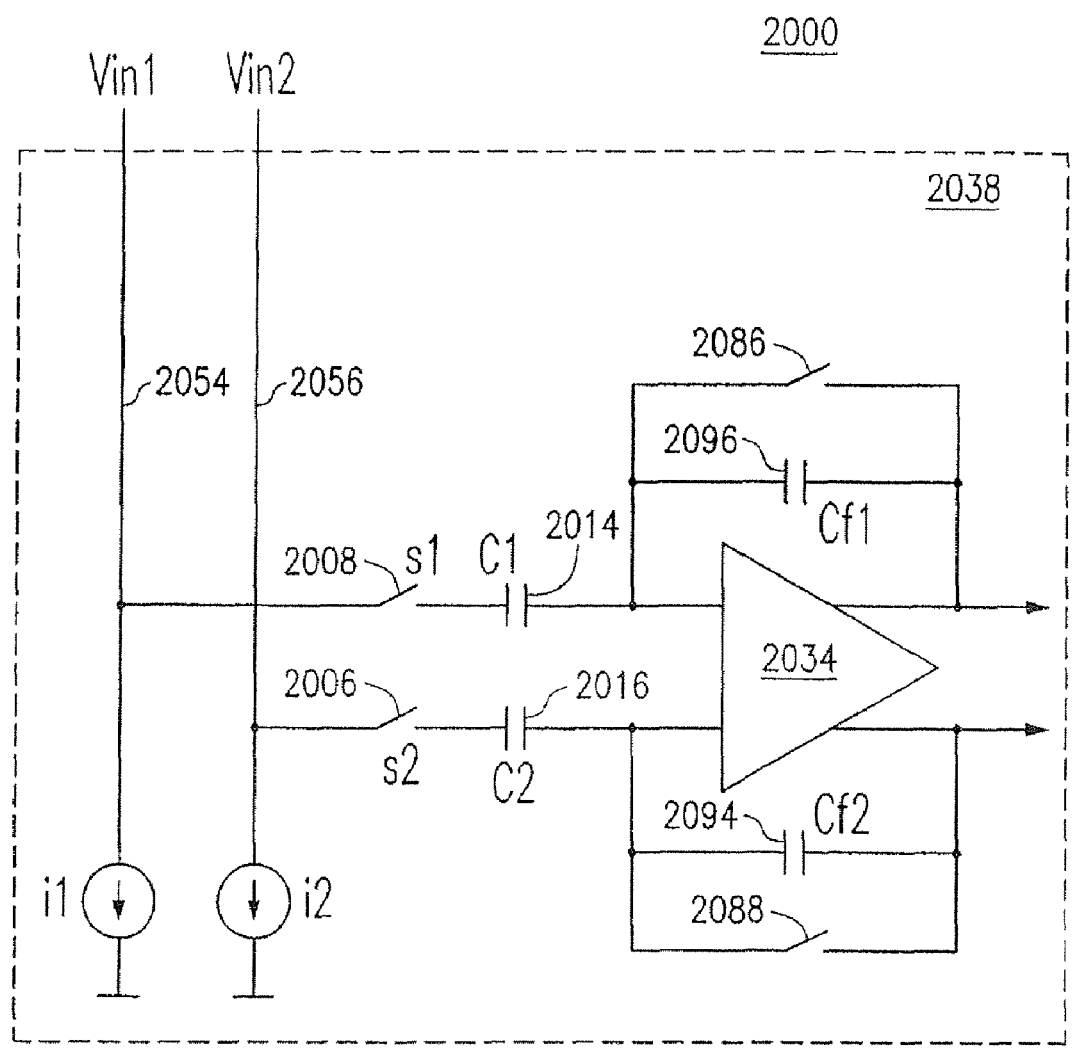
FIG. 20 is a differential column readout circuit in accordance with another exemplary embodiment of the invention.

FIG. 20 illustrates another exemplary embodiment of a differential column storage and readout circuit 2000 of the present invention. In this embodiment an amplifier is placed in each column.

The sample and hold circuit 2038 has a first signal input line 2054 from a first signal source which is switchably coupled through s1 switch 2008 to a first side of capacitor 2014. The back side of capacitor 2014 is coupled to a first signal input line of amplifier 2034. The sample and hold circuit 2038 has a second signal input line 2056 from a second signal source which is switchably coupled through s2 switch 2006 to a first side of second capacitor 2016. The back side of capacitor 2016 is coupled to a second signal input line of amplifier 2034. Signal input line 2054 is coupled to a desired pixel, and signal input line 2056 is coupled to a reference circuit.

The first signal input line to the amplifier 2034, i.e., the conductive line between the capacitor 2014 and amplifier 2034, is coupled to the first output from amplifier 2034 through capacitor 2096. The first signal input line to the amplifier 2034 is also switchably coupled to the first output from amplifier 2034 through switch 2086. The second signal input line to the amplifier 2034, i.e., the conductive line between the capacitor 2016 and amplifier 2034, is coupled to the second output from amplifier 2034 through capacitor 2094. The second signal input line to the amplifier 2034 is also switchably coupled to the second output from amplifier 2034 through switch 2088.

Figure 21:
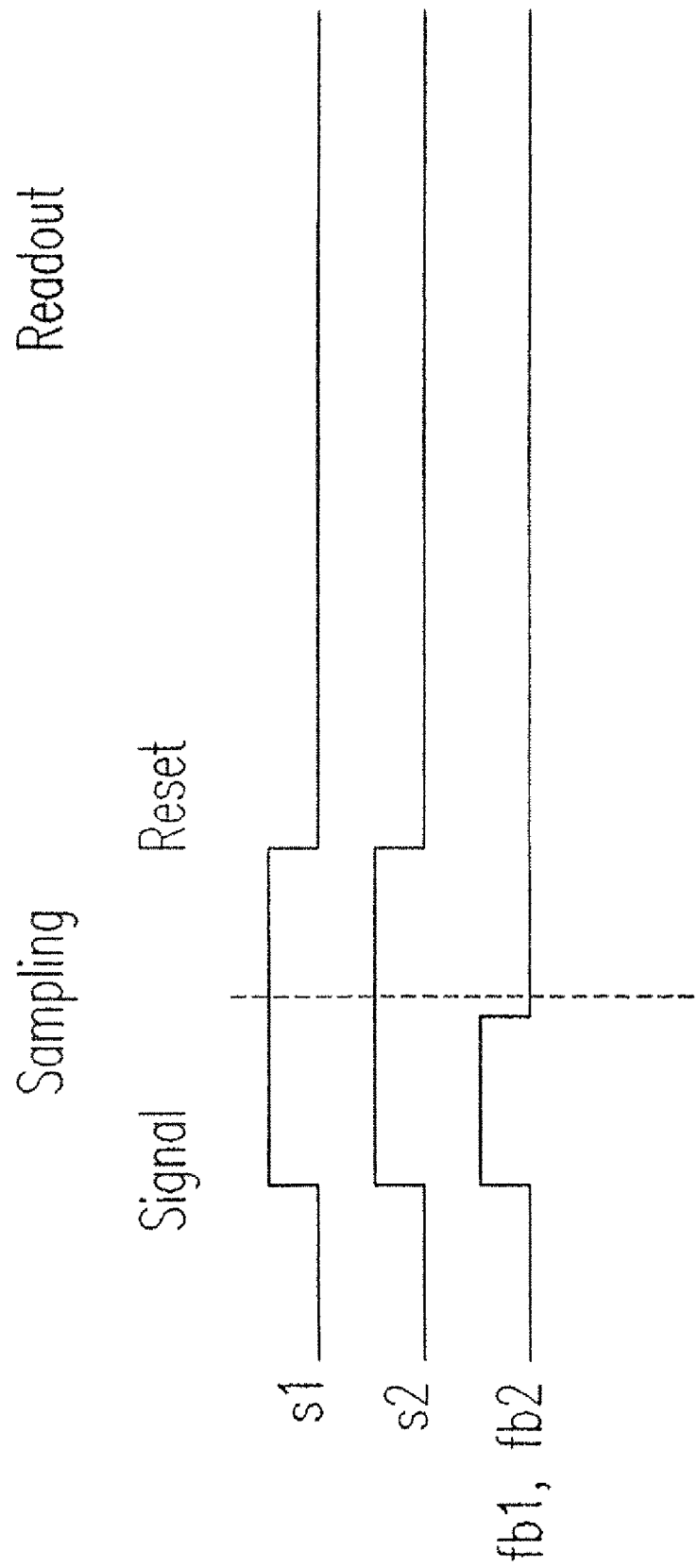
FIG. 21 is a simplified timing diagram associated with the circuitry of FIG. 20.

The operation of circuit 2038 of is now described with reference to the simplified signal timing diagram of FIG. 21 (implementing a read of a 3T pixel).

The s1 switch 2008 and s2 switch 2006 are pulsed by signals s1, s2 thereby enabling them. The switch 2086 and switch 2088 are pulsed by signals fb1, fb2 thereby temporarily enabling them. Thus, Vsig of a desired pixel and Vsig of a reference circuit are sampled and stored on respective capacitors 2014, 2016. The pulses fb1, fb2 are then disabled. Thus, Vrst of a desired pixel and Vrst of a reference circuit are sampled and stored on respective capacitors 2014, 2016. Then the pulses s1, 2 are disabled which forces the signals stored on the capacitors 2014, 2016 through amplifier 2034.

If C is the capacitance of capacitors 2014, 2016, and Cf is the capacitance of capacitors 2094, 2096 then the amplifier 2034 outputs:

$$V\text{diff}=(C/Cf)(V\text{sig}1-V\text{sig}2+V\text{rst}2-V\text{rst}1). \quad (12)$$

Therefore the circuit 2038 provides a differential output.

Figure 22:
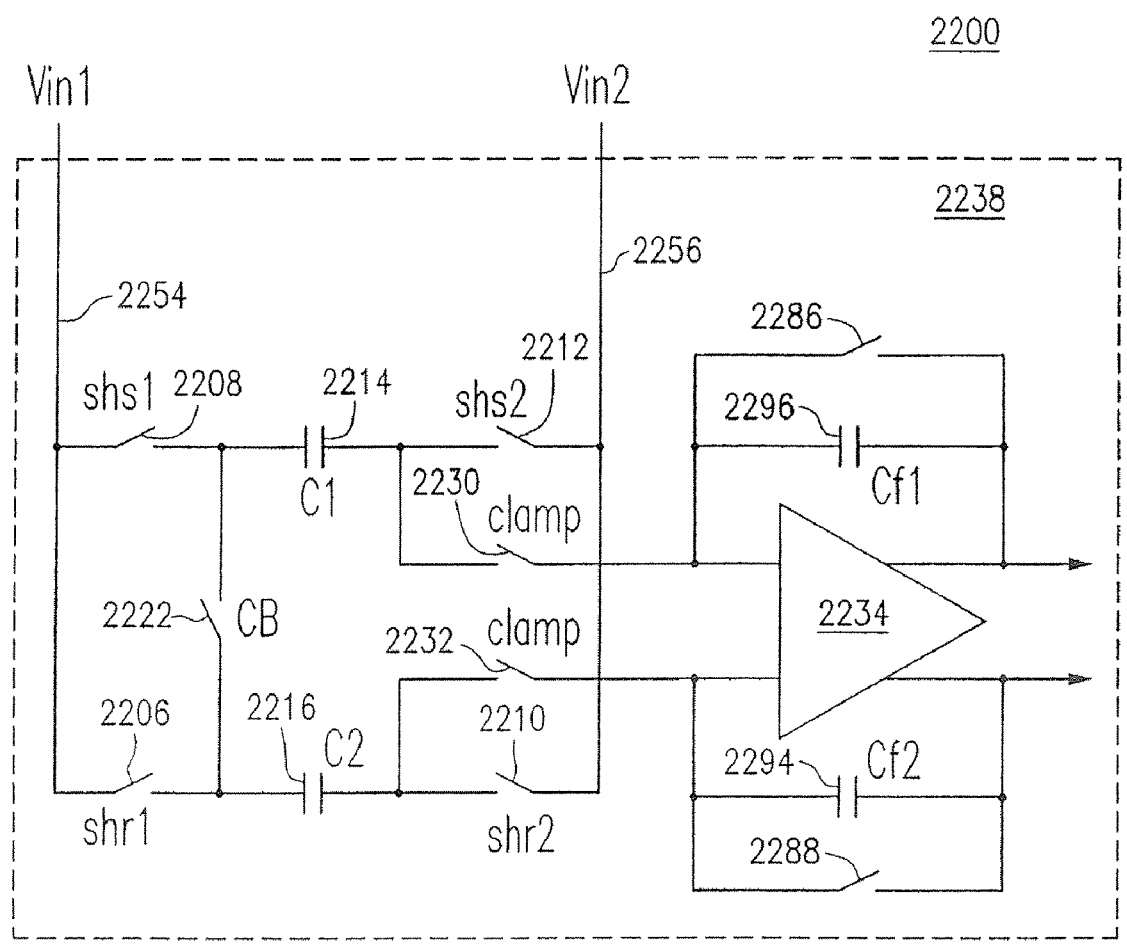
FIG. 22 is a differential column readout circuit in accordance with another exemplary embodiment of the invention.

FIG. 22 illustrates another exemplary embodiment of a differential column storage and readout circuit 2200 of the present invention. The circuit 2200 provides not only a differentiated signal output, but the signal output is also symmetric.

Sample and hold circuit 2238 stores each pair of input signals on a respective capacitor. For example, the Vsig of the desired pixel input on a first input line 2254 and the Vsig of the reference circuit input on a second input line 2256 are stored on capacitor 2214. Additionally, the Vrst of the desired pixel and the Vrst of the reference circuit are stored on capacitor 2216. In this way the charge on the first capacitor is $$C1=\tfrac{1}{2}(C)(V\text{sig}1-V\text{sig}2-V\text{rst}1+V\text{rst}2). \quad (13)$$

and the charge on the second capacitor is $$C2=\tfrac{1}{2}(C)(V\text{sig}1-V\text{sig}2+V\text{rst}1-V\text{rst}2) \quad (14)$$

Consequently, the readout charge injected into the amplifier would be the same voltage but oppositely charged. Additionally, the amplifier output provides elimination of a common noise component.

The sample and hold circuit 2238 has a first signal input line 2254 from a first signal source which is switchably coupled through respective shr1 reset sample switch 2206 and shs1 signal sample switch 2208 to a first side of respective capacitors 2216, 2214. The sample and hold circuit 2238 has a second signal input line 2256 from a second signal source which is switchably coupled through respective shr2 reset sample switch 2210 and shs2 signal sample switch 2212 to a second side of respective capacitors 2216, 2214. The back sides of respective capacitors 2216, 2214 is respectively switchably coupled to amplifier 2234 through clamp switches 2232, 2230. A crowbar switchably couples through a switch 2222 between on one side the conductive line between shr1 reset sample switch 2206 and capacitor 2216 and on the other side to the connection between the shs1 signal sample switch 2208 and capacitor 2214. Signal input line 2254 is coupled to a desired pixel, and signal input line 2256 is coupled to a reference circuit.

The first signal input line to the amplifier 2234, i.e., the conductive line between the switch 2230 and the amplifier 2234, is coupled to the first output from amplifier 2234 through capacitor 2296. The first signal input line to the amplifier 2234 is also switchably coupled to the first output from amplifier 2234 through switch 2286. The second signal input line to the amplifier 2234, i.e., the conductive line between switch 2232 and amplifier 2234, is coupled to the second output from amplifier 2234 through capacitor 2294. The second signal input line to the amplifier 2234 is switchably coupled to the second output from amplifier 2234 through switch 2288.

Figure 23:
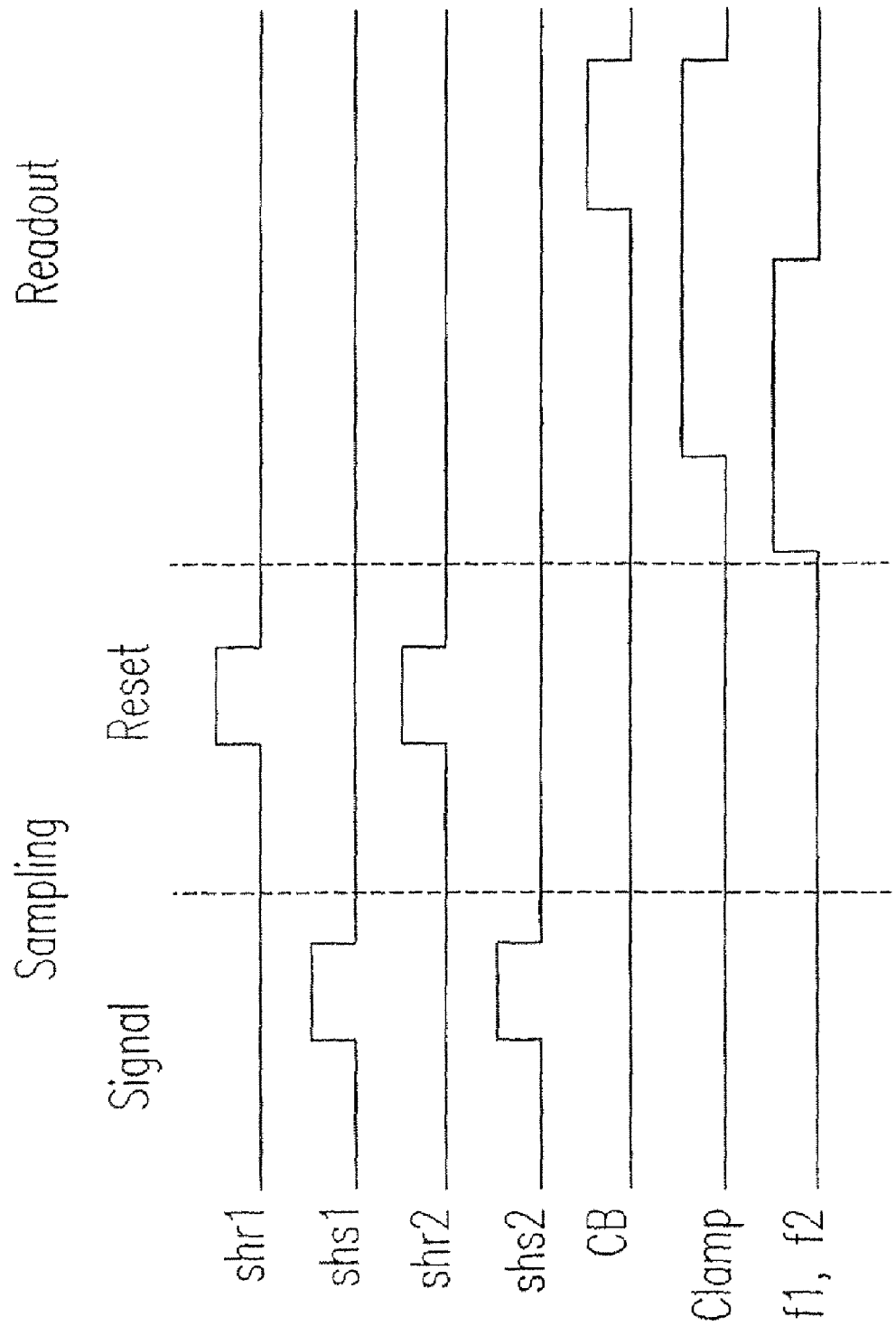
FIG. 23 is a simplified timing diagram associated with the circuitry of FIG. 22.

The operation of circuit 2238 is now described with reference to the simplified signal timing diagram of FIG. 23 (using a 3T pixel as input)

The shs1 signal sample switch 2208 and shs2 signal sample switch 2212 are pulsed by signals shs1, shs2 temporarily enabling them. Thus, Vsig of a desired pixel and Vsig of a reference circuit are sampled and stored on capacitor 2214. Pulses shr1, shr2 are applied temporarily enabling shr1 reset sample switch 2206 and shr2 reset sample switch 2210. Thus, Vrst of a desired pixel and Vrst of a reference circuit are sampled and stored on capacitor 2216.

The amplifier 2234 is then reset by applying pulses f1, f2 to switches 2286, 2288 to temporarily enable them. To read out the signals stored on capacitors 2216, 2214, the right plates of capacitors 2214, 2216 are coupled to the amplifier 2234 while still in the reset state, by applying a pulse clamp and temporarily enabling switches 2230, 2232. Then the signal stored on the capacitors 2216, 2214 are transferred when the switches 2286, 2288 are opened and applying a pulse CB closing crowbar switch 2222. Thus the signals stored on the respective capacitors 2216, 2214 are forced through the amplifier 2234. Amplifier 2234 outputs the resulting symmetric differential signals, thereby providing a fully differential, symmetric output in which common mode noise is eliminated.

Figure 24:
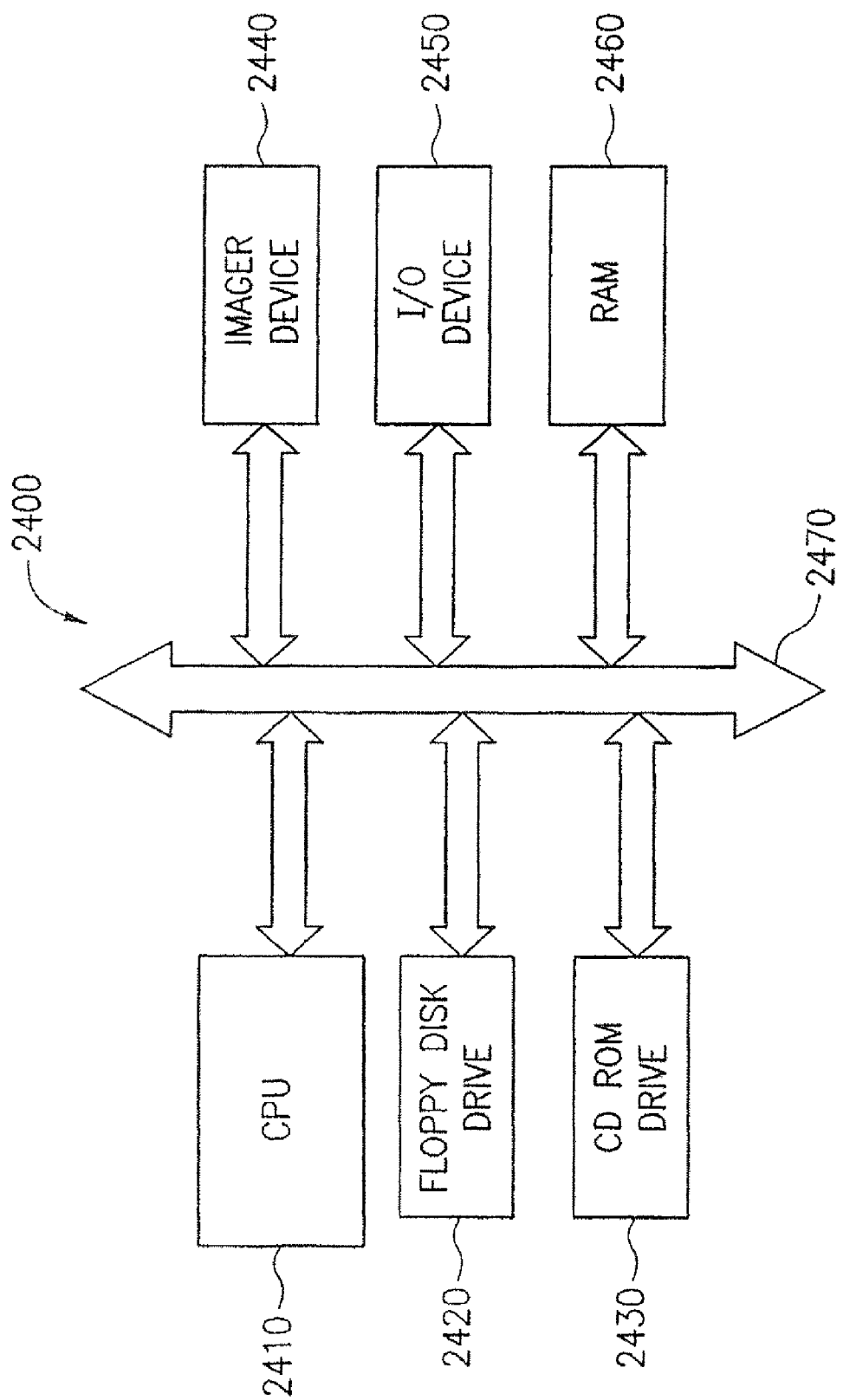
FIG. 24 is a block diagram representation of a processor-based system incorporating a CMOS imaging device in accordance with an exemplary embodiment of the invention.

The method and apparatus aspects of the invention are embodied in an image device 2440 shown in FIG. 24 which provides an image output signal. The image output signal can also be applied to a processor system 2400, also illustrated in FIG. 24. A processor based system, such as a computer system, for example, generally comprises a central processing unit (CPU) 2410, for example, a microprocessor, that communicates with one or more input/output (I/O) 2450 over a bus 2470. The CPU 2410 also exchanges data with random access memory (RAM) 2460 over bus 2470, typically through a memory controller. The processor system may also include peripheral devices such as a floppy disk drive 2420 and a compact disk (CD) ROM drive 2430 which also communicate with CPU 2410 over the bus 2470. Imager device 2440 is coupled to the processor system and includes a pixel storage and readout circuit as described along with respect to FIGS. 5, 7, 9, 11, 13, 15, 17, 19, 20, and 22.

While the invention has been described and illustrated with reference to specific exemplary embodiments, it should be understood that many modifications and substitutions can be made without departing from the spirit and scope of the invention. Although the embodiments discussed above describe specific numbers of transistors, photodiodes, conductive lines, the present invention is not so limited. Furthermore, many of the above embodiments described are shown with respect to the operation of the sample and hold of a desired pixel that is a 3T pixel, the spirit of the invention is not limited to 3T pixels. Additionally, although the amplifier appears to be within, or associated with, a column readout circuit, the amplifier may be accessible globally. Accordingly, the invention is not to be considered as limited by the foregoing description but is only limited by the scope of the claims.

What is claimed as new and desired to be protected by Letters Patent of the United States is:

1. A method of operating an imaging pixel array to provide a differential output, said method comprising:

storing a charge accumulated signal from a desired pixel and a comparison signal from a reference circuit;

storing a reset signal from the desired pixel and a reset signal from the reference circuit;

combining, in a column readout circuit, the charge accumulated signal from the desired pixel and the comparison signal from the reference circuit; and combining, in the column readout circuit, the reset signal from the desired pixel and the reset signal from the reference circuit.

2. The method of claim 1, wherein said first storing act further comprises simultaneously storing the charge accumulated signal from the desired pixel and the comparison signal from the reference circuit.

3. The method of claim 2, wherein said second storing act further comprises simultaneously storing the reset signal from the desired pixel and the reset signal from the reference circuit.

4. The method of claim 3, further comprising:

storing in a first storage area, the reset signal from the desired pixel and the reset signal from the reference circuit; and storing, in a second storage area, the charge accumulated signal from the desired pixel and the comparison signal from the reference circuit.

5. The method of claim 3, further comprising:

storing, in a first storage area, the reset signal from the desired pixel;

storing, in a second storage area, the reset signal from the reference circuit;

storing, in a third storage area, the charge accumulated signal from the desired pixel; and storing, in a fourth storage area, the comparison signal from the reference circuit.

6. The method of claim 4, further comprising including a first bias with the charge accumulated signal and the comparison signal.

7. The method of claim 6, further comprising including a second bias with the charge accumulated signal and the comparison signal.

8. The method of claim 7, further comprising including a common mode feedback bias with the charge accumulated signal and the comparison signal.

9. The method of claim 4, wherein the desired pixel is a pixel having a capacitor.

10. The method of claim 9, wherein the desired pixel is a 3T pixel.

11. The method of claim 9, wherein the desired pixel is a 4T pixel.

12. The method of claim 9, wherein the reference circuit is a reference circuit having a capacitor.

13. The method of claim 4, further comprising inputting the combined signals into an amplifier.

14. The method of claim 13, wherein the amplifier is a differential amplifier.

15. The method of claim 1, wherein the combined signals are symmetric.

16. An imager system, comprising:

a sample and hold circuit, comprising:

a first circuit for sampling and holding a reset signal and an image signal from a desired pixel;

a second circuit for sampling and holding a reset signal and a comparison signal from a reference circuit; and a readout circuit coupled to said first and second circuits, said readout circuit being configured to combine said image signal from said desired pixel and said comparison signal from said reference circuit, said readout circuit further configured to combine said reset signal from said desired pixel and said reset signal from said reference circuit.

17. The imager system of claim 16, wherein said first circuit further comprises first and second storage circuits for storing said respective image and reset signals from said desired pixel.

18. The imager system of claim 17, wherein said second circuit further comprises third and fourth storage circuits for storing said respective comparison and reset signals from said reference circuit.

19. The imager system of claim 18, wherein said first and third storage circuits are switchably coupled to a first input line of an amplifier and said second and fourth storage circuits are switchably coupled to a second input line of said amplifier.

20. The imager system of claim 18, wherein said first and fourth storage circuits are switchably coupled to a first input line of an amplifier and said second and third storage circuits are switchably coupled to a second input line of said amplifier.

21. The imager system of claim 18, wherein said first and second storage circuits are coupled to a first input line of an amplifier and said third and fourth storage circuits are coupled to a second input line of said amplifier.

* * * * *

UNITED STATES PATENT AND TRADEMARK OFFICE
CERTIFICATE OF CORRECTION

PATENT NO. : 7,755,018 B2
APPLICATION NO. : 12/405514
DATED : July 13, 2010
INVENTOR(S) : Sandor L. Barna et al.

It is certified that error appears in the above-identified patent and that said Letters Patent is hereby corrected as shown below:

Column 2, lines 44-45, "to a differential analog circuit and which subtracts" should read --to a differential analog circuit which subtracts--

Column 2, lines 49-50, "more clearly shows the column readout circuit 352 includes the sample" should read --more clearly shows the column readout circuit 352 that includes the sample--

Column 3, line 5, "capacitors 418, and 420" should read --capacitors 418, 420--

Column 3, lines 26-27, "The Vsig and Vrst voltages stored on the respective capacitors 420, 418 with reference to the precharge clamping voltage Vclamp" should read --The Vsig and Vrst voltages are stored on the respective capacitors 420, 418 with reference to the precharge clamping voltage Vclamp--

Column 4, line 20, "in accordance with an another" should read --in accordance with another--

Column 5, line 55, "is coupled a source/drain" should read --is coupled to a source/drain--

Column 6, lines 3-4, "is coupled a source/drain" should read --is coupled to a source/drain--

Column 6, line 6, "is coupled to pbais circuit 575" should read --is coupled to pbias circuit 575--

Column 7, equation 5, "Vdiff = (Vsig(pixel) – Vsig(reference)) – (Vrst(pixel) – Vrst(reference))." should read --Vdiff = (Vsig(pixel) – Vsig(reference)) – (Vrst(pixel) – Vrst(reference))--

Column 7, lines 62-63, "An additional difference is that order of reading" should read --An additional difference is that the order of reading--

Signed and Sealed this

Twenty-third Day of November, 2010

David J. Kappos
*Director of the United States Patent and Trademark Office*

CERTIFICATE OF CORRECTION (continued)
U.S. Pat. No. 7,755,018 B2

Column 8, equation 7, "C2 = (Vrst1 – Vrst2)." should read --C2 = (Vrst1 – Vrst2)--

Column 10, equation 9, "Vout1 = ½ (Vsig(pixel) + Vrst(reference))." should read --Vout1 = ½ (Vsig(pixel) + Vrst(references--

Column 10, equation 10, "Vout2 = ½ (Vsig(reference) + Vrst(pixel))." should read --Vout2 = ½ (Vsig(reference) + Vrst(pixel))--

Column 10, equation 11, "Vdiff = ½ ((Vsig(pixel) – Vrst(pixel)) – (Vsig(reference) – Vrst(reference))." should read --Vdiff = ½ ((Vsig(pixel) – Vrst(pixel)) – (Vsig(reference) – Vrst(reference))--

Column 14, line 17, "The operation of circuits of is now described" should read --The operation of circuit 1938 is now described--

Column 15, line 4, "The operation of circuit 2038 of is now described" should read --The operation of circuit 2038 is now described--

Column 15, line 6, "(implementing a read of a 3T pixel)" should read --(implementing a read from a 3T pixel)--

Column 15, equation 12, "Vdiff = (C/Cf) (Vsig1 –Visg2 + Vrst2 – Vrst1)." should read --Vdiff = (C/Cf) (Vsig1 – Visg2 + Vrst2 – Vrst1)--

Column 15, equation 13, "Cl = ½ (C) (Vsig1 – Vsig2 – Vrst1 + Vrst2)." should read --Cl = ½ (C) (Vsig1 – Vsig2 – Vrst1 + Vrst2)--

Column 16, lines 8-9, "(using a 3T pixel as input)" should read --(using a 3T pixel as input).--

Column 16, lines 54-58, "Furthermore, many of the above embodiments described are shown with respect to the operation of the sample and hold of a desired pixel that is a 3T pixel, the spirit of the invention is not limited to 3T pixels." should read --Furthermore, many of the above embodiments described are shown with respect to the operation of the sample and hold of a desired pixel that is a 3T pixel; it should be appreciated, however, that the spirit of the invention is not limited to 3T pixels.--